(12) United States Patent
Schulze et al.

(10) Patent No.: US 10,903,078 B2
(45) Date of Patent: Jan. 26, 2021

(54) METHODS FOR PROCESSING A SILICON CARBIDE WAFER, AND A SILICON CARBIDE SEMICONDUCTOR DEVICE

(71) Applicant: Infineon Technologies AG, Neubiberg (DE)

(72) Inventors: Hans-Joachim Schulze, Taufkirchen (DE); Alexander Breymesser, Villach (AT); Guenter Denifl, Annenheim (AT); Mihai Draghici, Villach (AT); Bernhard Goller, Villach (AT); Tobias Franz Wolfgang Hoechbauer, Villach (AT); Wolfgang Lehnert, Lintach (DE); Roland Rupp, Lauf (DE); Werner Schustereder, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/422,659

(22) Filed: May 24, 2019

(65) Prior Publication Data
US 2019/0362972 A1    Nov. 28, 2019

(30) Foreign Application Priority Data

May 28, 2018  (DE) .......................... 10 2018 112 729
May 2, 2019   (DE) .......................... 10 2019 111 377

(51) Int. Cl.
*H01L 21/04*   (2006.01)
*H01L 29/16*   (2006.01)
(Continued)

(52) U.S. Cl.
CPC ...... *H01L 21/0445* (2013.01); *H01L 21/0262* (2013.01); *H01L 21/02378* (2013.01);
(Continued)

(58) Field of Classification Search
CPC ............ H01L 21/0445; H01L 29/1608; H01L 21/26506; H01L 21/02378;
(Continued)

(56) References Cited

U.S. PATENT DOCUMENTS

2002/0182827 A1\* 12/2002 Abe ................. H01L 21/76243
                                                  438/455
2003/0056718 A1\*  3/2003 Kawahara ............... C30B 33/00
                                                  117/84
(Continued)

OTHER PUBLICATIONS

Okojie, Robert S., et al., "4H-to 3C-SiC Polytypic Transformation During Oxidation", Materials Science Forum vols. 389-393, 2002, Trans Tech Publications, Switzerland, pp. 451-454.
(Continued)

*Primary Examiner* — Bitew A Dinke
(74) *Attorney, Agent, or Firm* — Murphy, Bilak & Homilier, PLLC

(57) ABSTRACT

A method for processing a silicon carbide wafer includes implanting ions into the silicon carbide wafer to form an absorption layer in the silicon carbide wafer. The absorption coefficient of the absorption layer is at least 100 times the absorption coefficient of silicon carbide material of the silicon carbide wafer outside the absorption layer, for light of a target wavelength. The silicon carbide wafer is split along the absorption layer at least by irradiating the silicon carbide wafer with light of the target wavelength to obtain a silicon carbide device wafer and a remaining silicon carbide wafer.

28 Claims, 7 Drawing Sheets

(51) Int. Cl.
*H01L 21/265* (2006.01)
*H01L 21/02* (2006.01)
*H01L 21/324* (2006.01)

(52) U.S. Cl.
CPC .. *H01L 21/02529* (2013.01); *H01L 21/26506* (2013.01); *H01L 21/324* (2013.01); *H01L 29/1608* (2013.01)

(58) Field of Classification Search
CPC ........... H01L 21/02529; H01L 21/0262; H01L 21/324; H01L 21/76254; H01L 21/78; H01L 21/7806; H01L 21/762; H01L 21/76259; H01L 2924/35121
See application file for complete search history.

(56) References Cited

U.S. PATENT DOCUMENTS

| | | | | |
|---|---|---|---|---|
| 2010/0006969 | A1* | 1/2010 | Park | H01L 27/14621 257/446 |
| 2011/0121317 | A1* | 5/2011 | Shibagaki | H01L 21/046 257/77 |
| 2011/0298083 | A1* | 12/2011 | Yoneda | H01L 21/84 257/506 |
| 2013/0009171 | A1* | 1/2013 | Harada | H01L 29/045 257/77 |
| 2014/0038392 | A1* | 2/2014 | Yonehara | B81C 1/0038 438/463 |
| 2014/0226346 | A1* | 8/2014 | Kobayashi | H05K 1/0274 362/382 |
| 2014/0252373 | A1* | 9/2014 | Mauder | H01L 21/7813 257/77 |
| 2014/0264374 | A1* | 9/2014 | Hecht | H01L 21/02529 257/77 |
| 2015/0214040 | A1* | 7/2015 | Celler | H01L 21/76254 438/458 |
| 2015/0303097 | A1* | 10/2015 | Konishi | H01L 21/302 257/506 |
| 2016/0276209 | A1* | 9/2016 | Usenko | H01L 21/76254 |
| 2017/0033011 | A1* | 2/2017 | Rupp | H01L 29/2003 |
| 2017/0278930 | A1* | 9/2017 | Ruhl | H01L 21/78 |
| 2017/0372965 | A1* | 12/2017 | Nishibayashi | H01L 21/02002 |
| 2018/0334757 | A1* | 11/2018 | Kubota | H01L 21/02002 |
| 2019/0080957 | A1* | 3/2019 | Peidous | H01L 21/76243 |
| 2019/0153616 | A1* | 5/2019 | Yagi | C30B 29/36 |
| 2019/0157395 | A1* | 5/2019 | Schulze | H01L 21/0485 |
| 2019/0296125 | A1* | 9/2019 | Schulze | H01L 29/7802 |
| 2019/0363057 | A1* | 11/2019 | Santos Rodriguez | H01L 23/562 |
| 2020/0013859 | A1* | 1/2020 | Schaeffer | H01L 21/0485 |
| 2020/0068709 | A1* | 2/2020 | Schulze | H01L 21/76254 |
| 2020/0194558 | A1* | 6/2020 | Brockmeier | H01L 21/02378 |

OTHER PUBLICATIONS

Si, Weimin, et al., "Investigations of 3C-SiC Inclusions in 4H-SiC Epilayers on 4H-SiC Single Crystal Substrates", Journal of Electronic Materials, vol. 26, No. 3, 1997, pp. 151-156.

* cited by examiner

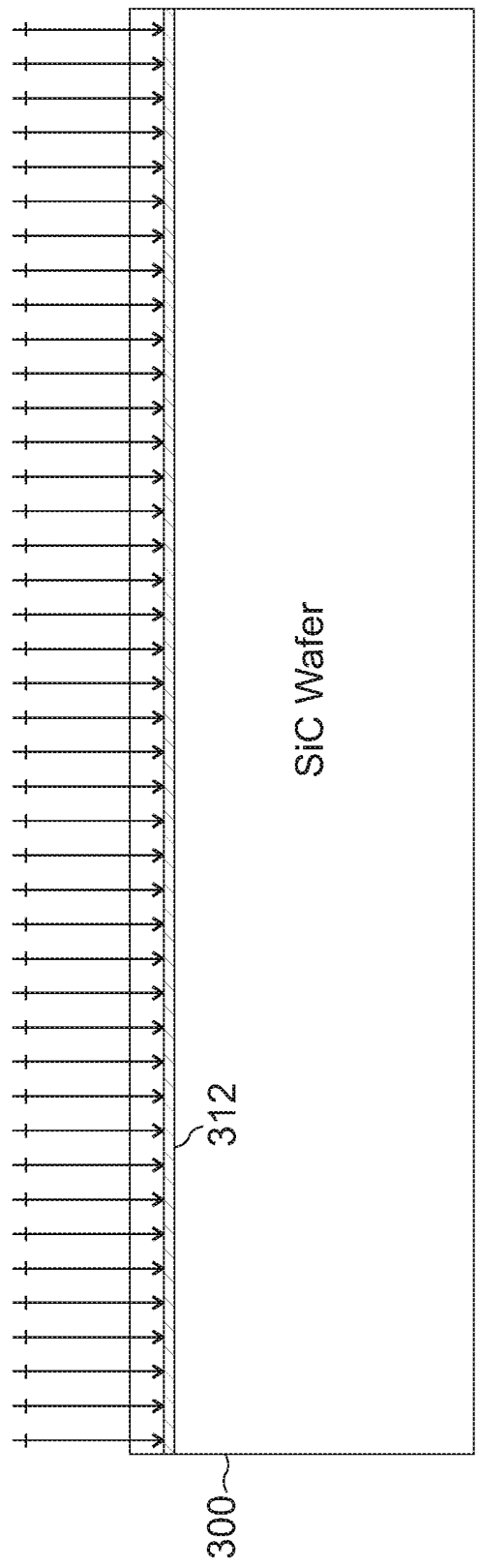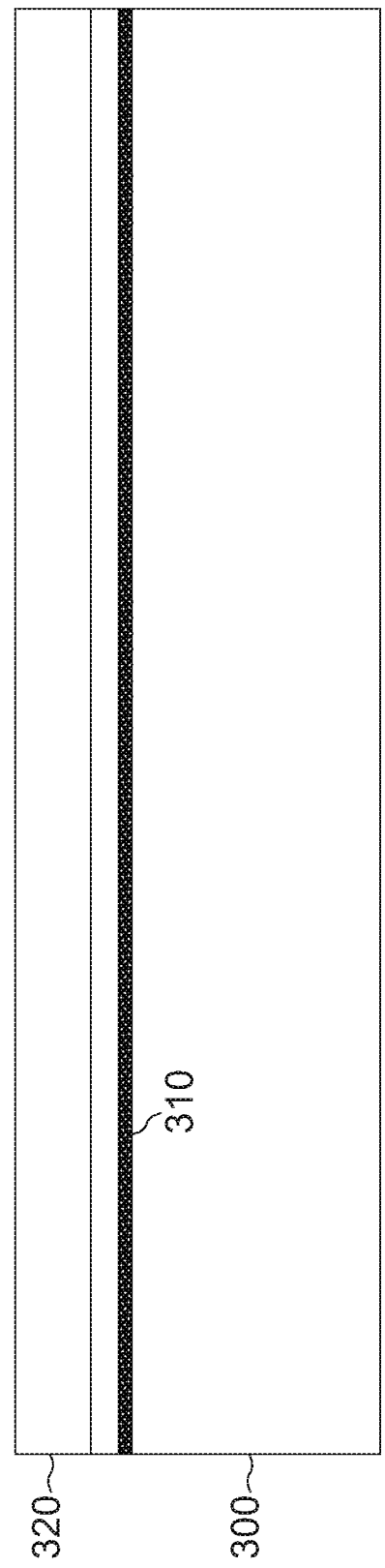

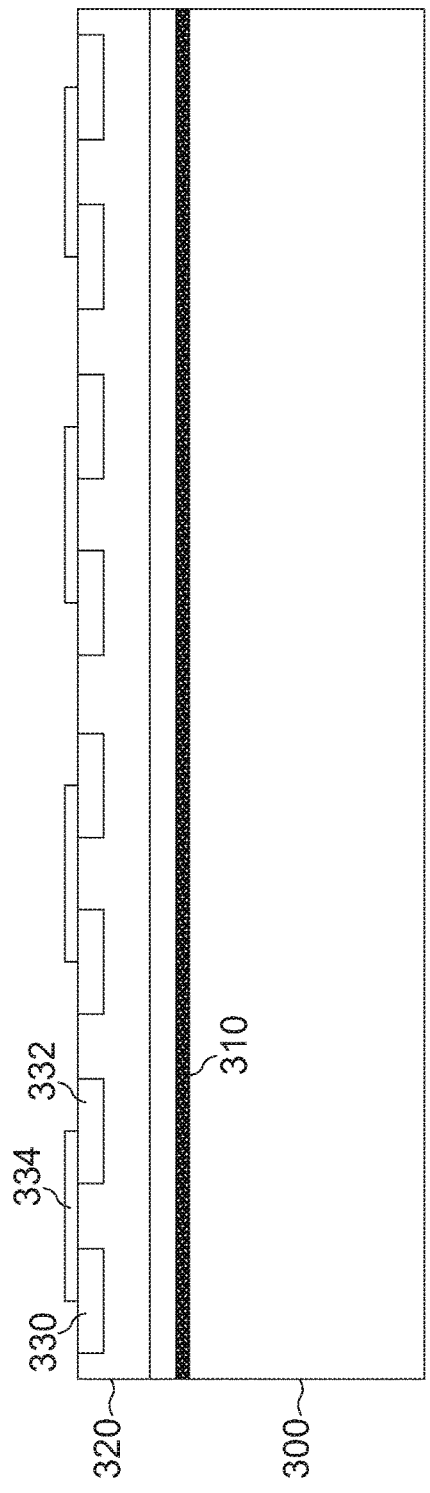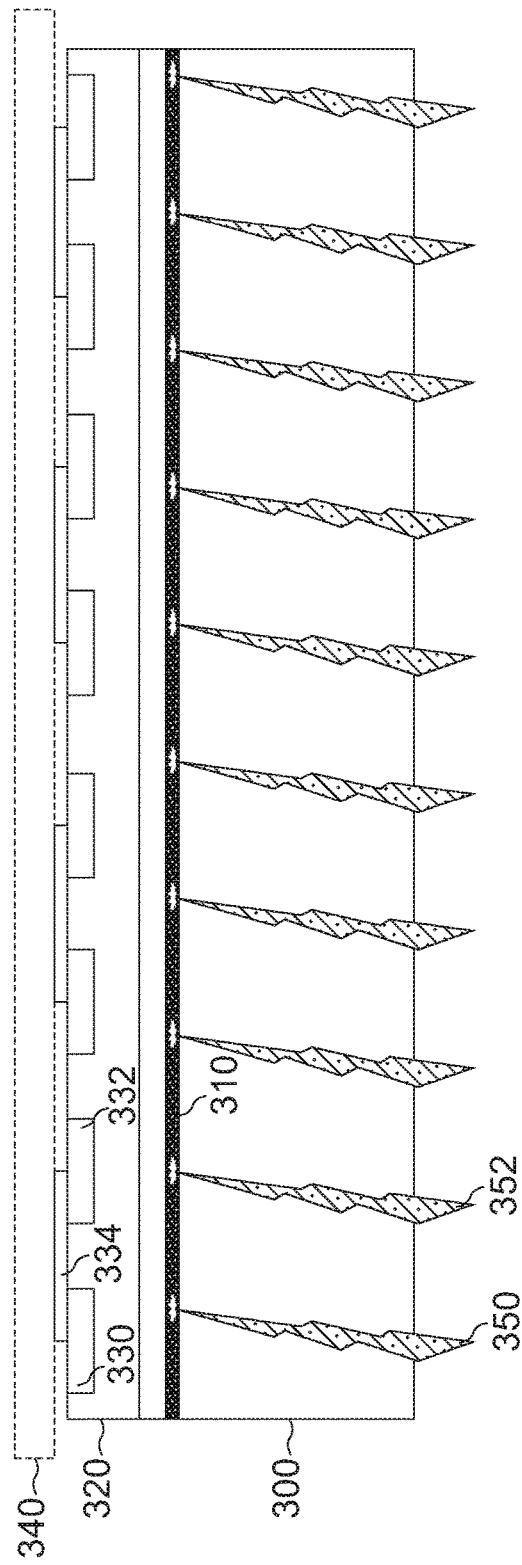

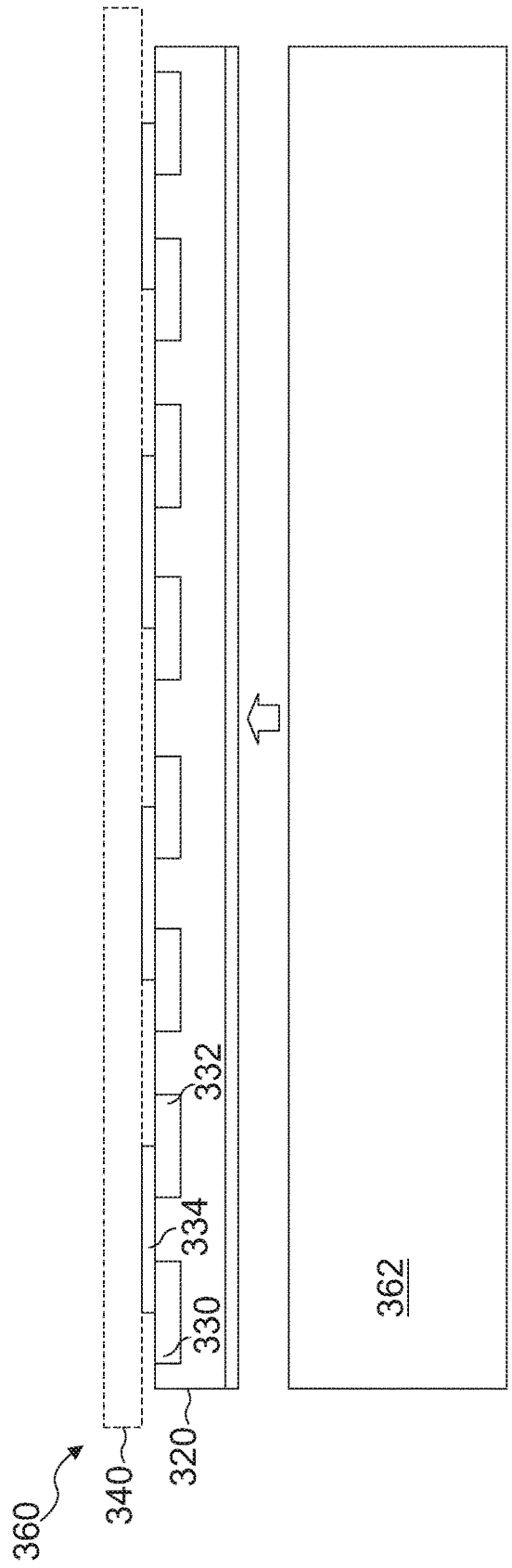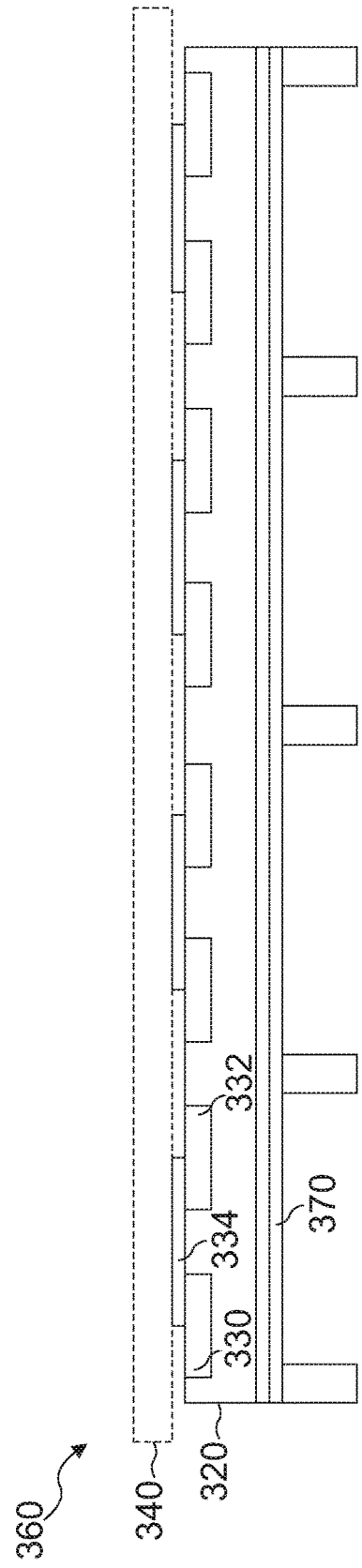

METHODS FOR PROCESSING A SILICON CARBIDE WAFER, AND A SILICON CARBIDE SEMICONDUCTOR DEVICE

TECHNICAL FIELD

Examples relate to methods for processing a silicon carbide wafer and to a silicon carbide semiconductor device.

BACKGROUND

Methods for forming silicon carbide semiconductor devices can include grinding a silicon carbide wafer, e.g. to reduce an electrical resistance of the silicon carbide semiconductor device. Grinding can be time consuming and may include high consumption of silicon carbide material, resulting in high costs for silicon carbide devices. For example, no re-use concepts for forming further silicon carbide semiconductor devices using the silicon carbide wafer are possible in this case.

Silicon carbide wafers may be split so that reuse concepts can be enabled. However, splitting the silicon carbide wafer may limit some semiconductor processes required for forming a silicon carbide semiconductor device or may result in imprecise thickness of the split wafer part of the silicon carbide wafer. For example, a required thickness of a split wafer part might not be achievable by using some splitting concepts. There may be a desire for improved concepts for processing silicon carbide wafers.

SUMMARY

An example relates to a method for processing a silicon carbide wafer. According to the example, ions are implanted into the silicon carbide wafer to form an absorption layer in the silicon carbide wafer. For light of a target wavelength, an absorption coefficient of the absorption layer is at least 100 times an absorption coefficient of a silicon carbide material of the silicon carbide wafer outside the absorption layer. Further, the method according to the example comprises splitting the silicon carbide wafer along the absorption layer at least by irradiating the silicon carbide wafer with light of the target wavelength to obtain a silicon carbide device wafer and a remaining silicon carbide wafer.

Another example relates to a silicon carbide semiconductor device. The silicon carbide semiconductor device comprises a silicon carbide semiconductor substrate having a 4H-crystal structure, and a metallization structure at a front side of the silicon carbide semiconductor substrate. Further, the silicon carbide semiconductor device comprises a back side layer located at a back side surface of the silicon carbide semiconductor substrate. The back side layer has a thickness of at least 50 nm and at least partly has a 3C-crystal structure.

BRIEF DESCRIPTION OF THE FIGURES

Some examples of apparatuses and/or methods will be described in the following by way of example only, and with reference to the accompanying figures, in which

FIGS. 7a-7h show an example of a method for splitting a semiconductor wafer along an implanted layer by laser illumination.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
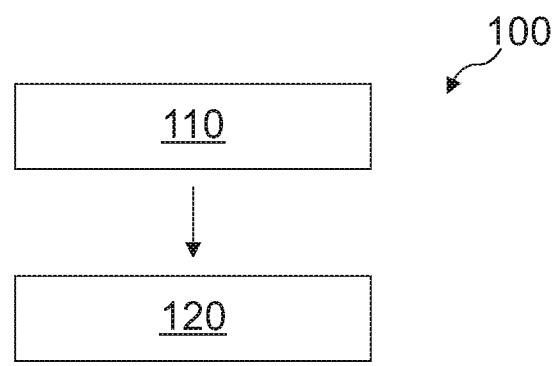
FIG. 1 shows a flow chart of a method for processing a silicon carbide wafer comprising splitting the silicon carbide wafer.

FIG. 1 shows a flow chart of a method 100 for processing a silicon carbide wafer according to an embodiment. The silicon carbide wafer may be a doped silicon carbide crystal (e.g., with a doping concentration of at least $2 \cdot 10^{17}$ cm$^{-3}$ and at most $1 \cdot 10^{19}$ cm$^{-3}$, for example of at least $5 \cdot 10^{17}$ cm$^{-3}$ and at most $1 \cdot 10^{19}$ cm$^{-3}$) or may be nominally undoped (e.g., with a doping concentration of at most $1 \cdot 10^{17}$ cm$^{-3}$ or of at most $1 \cdot 10^{15}$ cm$^{-3}$; so-called "not intentionally doped silicon carbide"). The method 100 may comprise implanting 110 ions into the silicon carbide wafer to form an absorption layer within the silicon carbide wafer. The ions may be implanted 110 into the silicon carbide material of the silicon carbide wafer within a region extending laterally over the silicon carbide wafer. Additionally, the silicon carbide wafer with the implanted ions may be annealed to form the absorption layer, for example. The absorption layer may be a lateral absorption layer and/or a buried absorption layer. The absorption layer may extend over the entire silicon carbide wafer or over at least 95% of the wafer area. For example, the ions may be implanted through a front side surface of the silicon carbide wafer. For example, an implantation depth or distance of the absorption layer to the surface of the silicon carbide wafer depends on the selected implantation energy.

A lateral absorption layer may have a lateral dimension significantly larger than a vertical dimension. For example, a maximal lateral dimension of the lateral absorption layer may be at least five times (or at least 10 times, or at least 20 times, or at least 100 times or at least 1000 times or at least 10000 times or at least 50000 times) a maximal vertical dimension of the lateral absorption layer. The lateral absorption layer may be located at a surface of the silicon carbide wafer or may be buried within the silicon carbide wafer. The vertical dimension may be measured orthogonal to a front side surface of the silicon carbide wafer and the lateral dimension may be measured in parallel to the front side surface of the silicon carbide wafer.

For example, the buried absorption layer may be formed within the silicon carbide wafer so that the buried absorption layer is located at a distance to a surface of the silicon carbide wafer. In other words, the buried absorption layer may be buried within the silicon carbide wafer. For example, a first portion of the silicon carbide wafer is located between a front side surface of the silicon carbide wafer and the buried absorption layer and a second portion of the silicon carbide wafer is located between a back side surface of the silicon carbide wafer and the buried absorption layer.

For example, an absorption coefficient of the absorption layer may be higher than an absorption coefficient of a silicon carbide material of the silicon carbide wafer outside the absorption layer at least for light of a target wavelength. That is to say, the absorption layer may have a higher refractive index (e.g., a higher imaginary part) than the silicon carbide material at least for the target wavelength. Hereinafter, an absorption coefficient of a layer and/or a material may be the average absorption coefficient of said layer and/or said material, respectively, wherein regions of the layer and/or the material that have an absorption coefficient deviating by more than two standard deviations from the average absorption coefficient may not be accounted for in the average.

The silicon carbide material of the silicon carbide wafer outside the absorption layer may at least vertically surround the absorption layer. The absorption coefficient of the absorption layer may be at least 5 times (or at least 10 times, at least 20 times, at least 30 times, or at least 50 times) of the absorption coefficient of the silicon carbide material of the silicon carbide wafer outside the absorption layer, or the absorption coefficient of the absorption layer may be at least 100 times (or at least 200 times, at least 500 times, at least 850 times, or at least 1000 times) of the absorption coefficient of the silicon carbide material of the silicon carbide wafer outside the absorption layer, for light of the target wavelength. Achieving an absorption coefficient of the absorption layer e.g. higher than 100 times the absorption coefficient of the silicon carbide material of the silicon carbide wafer outside the absorption layer, e.g. in a silicon carbide wafer used for forming a semiconductor device, may be possible by using a concept proposed in the following.

The target wavelength may be a characteristic wavelength (e.g. wavelength of laser or maximum in spectrum) of the light used for splitting 120 the silicon carbide (SiC) wafer. For example, the term "light of a target wavelength" may refer to light with a wavelength distribution that has a local, in particular a global, maximum at the target wavelength. In addition or as an alternative, the term "light of a target wavelength" may denote light with a frequency distribution that has a local, in particular a global, maximum that differs by at most 1 GHz (or at most 0.5 GHz or at most 100 MHz) from the frequency corresponding to the target wavelength. However, higher frequency deviations of the local or global maximum of the frequency distribution may be possible, for example, if the energy of the light of the target wavelength exceeds an energy required for chemical decomposition of the absorption layer. Hereinafter, the term "light" is not to be construed as including only visible wavelength, but rather refers to electromagnetic radiation, such as, e.g., visible light, UV light and infrared light.

The ions implanted 110 into the silicon carbide material may increase the absorption coefficient within the absorption layer compared to the silicon carbide material without the implanted ions. For example, an implantation dose may be adjusted and/or a species of the implanted ions may be chosen depending on the wafer material, to achieve the higher absorption coefficient and/or to control a value of the absorption coefficient of the absorption layer.

The method 100 may further comprise splitting 120 the silicon carbide wafer along the absorption layer. For example, the absorption layer may be formed to provide a defined splitting region of the silicon carbide wafer. Splitting 120 may be achieved by at least irradiating the silicon carbide wafer with light of the target wavelength. For example, the silicon carbide wafer may be split solely by irradiating the silicon carbide wafer or additional processes (e.g. heating, applying mechanical stress and/or force and/or ultrasonic treatment) may be performed to split the SiC (silicon carbide) wafer.

For splitting 120 the silicon carbide wafer, e.g. an energy of the light of the target wavelength may be selected based on an energy necessary to split the SiC wafer, based on the absorption coefficient of the absorption layer, based on a thickness of the silicon carbide wafer, based on a thickness of the absorption layer and/or based on a position of the absorption layer within the silicon carbide wafer (e.g., to account for additional absorption by the silicon carbide wafer). The light of the target wavelength may be irradiated onto the front side and/or onto a back side of the silicon carbide wafer. Due to the higher absorption coefficient of the absorption layer, a larger portion of the light of the target wavelength may be absorbed within the absorption layer than in the SiC material of the SiC wafer outside the absorption layer. For example, the light of the target wavelength absorbed within the absorption layer may cause decomposition or destruction of at least a part, e.g. a laterally connected area, of the absorption layer so that the silicon carbide wafer may be split 120 along the absorption layer.

Released energy of the light of the target wavelength absorbed within the absorption layer may cause splitting 120 of the silicon carbide wafer.

For example, a silicon carbide device wafer and a remaining silicon carbide wafer may be obtained by splitting 120 the silicon carbide wafer. Both the remaining silicon carbide wafer and the silicon carbide device wafer may comprise the silicon carbide material of the silicon carbide wafer outside the absorption layer as a main material or may consist of said silicon carbide material. Splitting 120 the silicon carbide wafer along the absorption layer by irradiating the absorption layer may enable to define a thickness of the silicon carbide device wafer more exactly and/or with reduced variation along a lateral extension of the silicon carbide device wafer and/or more homogenously along a lateral extension of the silicon carbide device wafer, e.g. compared to other splitting methods. For example, the method 100 may improve the control over the thickness of the silicon carbide device wafer. A thickness of the absorption layer may be smaller compared to a thickness of other splitting regions so that a variation of the thickness of the silicon carbide device wafer may be reduced. Also, a consumption of material of the silicon carbide wafer for splitting 120 may be reduced by providing the absorption layer with reduced thickness, e.g. compared to using thicker splitting regions, which might in particular be required by other concepts without using an absorption layer.

Examples relate to aspects which may enable to form absorption layers with an absorption coefficient higher than 5 times, or even higher than 100 times, compared to the absorption coefficient of the silicon carbide material of the silicon carbide wafer outside the absorption layer. In order to increase the absorption coefficient of the absorption layer, it may be necessary to implant 110 ions with an increased implantation dose. However, when ions are implanted 110 through a first surface of the silicon carbide wafer, defects such as vacancies may occur at the first surface and/or in a region near the first surface. With a higher implantation dose, the defect density may increase. Such defects, e.g. above a critical defect density, may limit a quality of an epitaxial layer grown on the first surface, for example.

For example, above a critical implantation dose (e.g. used for implanting 110 the ions to form the absorption layer), surface irregularities (e.g. defects such as vacancies and/or vacancy-clusters) may develop after implantation which may e.g. hinder proper epitaxial growth on the surface (e.g. growth of an epitaxial silicon carbide layer having a 4H-crystal structure, i.e. a 4H—SiC layer). For example, a high quality epitaxial layer may be required and the maximum absorption capacity (e.g. upper limit of the absorption coefficient) of the introduced layer (e.g. the absorption layer) may be limited according to some examples, as a maximal implantation dose for implanting 110 ions may be limited due to the occurrence of surface defects. For example, a vacancy concentration of e.g. $3 \cdot 10^{22}$ cm$^{-3}$ in a region near or in direct contact with the first surface after implantation may be an upper limit for proper epitaxial growth (e.g. independent of a type of implanted 110 species or ions). In the following, the vacancy concentration in a region near or in direct contact with a certain surface will also be referred to as vacancy concentration "of" said certain surface.

It may be necessary to provide methods enabling an increased implantation dose for forming the absorption layer with an increased absorption coefficient while keeping a defect concentration, e.g. a maximal vacancy concentration, of a silicon carbide wafer surface below a limit. In the following, examples are proposed that may enable to form an absorption layer with a high absorption coefficient while providing a good surface quality of a surface of the silicon carbide wafer the ions are implanted 110 through.

For example, a temperature of the silicon carbide wafer during implanting 110 the ions may be at least 250° C. (or at least 300° C., at least 350° C., at least 400° C., at least 450° C., at least 500° C., at least 600° C., at least 700° C., or at least 800° C.) and/or at most 1000° C. (or at most 800° C., at most 700° C., or at most 600° C.). For example, before implanting 110 ions into the silicon carbide wafer to form the absorption layer, the silicon carbide wafer may be heated to a temperature of at least 300° C. and the temperature of the silicon carbide wafer may be kept at a temperature above 300° C. during implanting 110 the ions.

When implanting ions through a surface of the silicon carbide wafer at an elevated temperature during implantation, defects of or close to the surface (e.g. surface near crystal damage, such as e.g. V, V2, $Z_{1,2}$ and/or other defects) may be limited. For example, when implanting 110 ions at a temperature of the silicon carbide wafer of 300° C. or higher, good crystal quality (e.g. of an epitaxial layer) after high dose implantation may be achieved. For example, stable end of range defects (e.g. within the absorption layer) might not be significantly influenced by the elevated temperatures. A temperature range to be used may be between 300° C. and a maximal implantation temperature, e.g. 700° C. For example, at the surface of the silicon carbide wafer, a 4H—SiC configuration may be kept at implantation temperatures from 300° C. and higher. In other processes, e.g. with high dose implantation at a wafer temperature of only 200° C. (and e.g. with an 1800° C. anneal for e.g. 3 minutes after implantation), a 3C—SiC epitaxial layer may grow on the surface. As for forming the absorption layer high implantation doses may be needed, an additional time needed to increase the wafer temperature from room temperature to the elevated temperature (e.g. above 300° C.) may only insignificantly increase process cost or time.

For example, implanting 110 the ions may be done by two or more implantation processes and an intermediate process as e.g. annealing or layer growth in between. Accordingly, ions may be implanted with a first implantation dose. After implanting the ions with the first implantation dose, a separate process may be performed to obtain a wafer surface with reduced near surface crystal defects or less near surface crystal defects (e.g. lower defect density), for example. Subsequently, implanting 110 the ions may comprise implanting ions with a second implantation dose after obtaining the wafer surface with reduced near surface crystal defects. The ions may be implanted with the second implantation dose through the surface with reduced or lower defect density.

The first implantation dose may be above a critical dose, if e.g. the defect density at the surface is reduced after implanting the first implantation dose. For example, when implanting ions with an implantation dose above the critical dose, before reducing the near surface crystal defects to obtain the wafer surface with reduced near surface crystal defects, only a low quality epitaxial layer may be grown on the surface, whereas after reducing the near surface crystal defects, a high quality epitaxial layer may be grown on the surface. For example, the first and/or second implantation dose may be at most $3.0 \cdot 10^{16}$ cm$^{-2}$ (or at most $2.00 \cdot 10^{16}$ cm$^{-2}$, at most $1.35 \cdot 10^{16}$ cm$^{-2}$, at most $1.2 \cdot 10^{16}$ cm$^{-2}$, at most $1.0 \cdot 10^{16}$ cm$^{-2}$, at most $1.8 \cdot 10^{15}$ cm$^{-2}$, at most $4.0 \cdot 10^{14}$ cm$^{-2}$, or at most $2.0 \cdot 10^{14}$ cm$^{-2}$). For example, the first and/or second implantation dose may be at most $1.35 \cdot 10^{16}$ cm$^{-2}$ for implantation of nitrogen atoms or at most $1.8 \cdot 10^{15}$ cm$^{-2}$ for implantation of phosphorous ions. For example, the first and/or second implantation dose may be a critical dose.

For example, after implanting the ions with the second implantation dose, again a wafer surface with reduced near surface crystal defects may be obtained, e.g. by a further process, and subsequently, a third implantation step may be performed by implanting ions with a third implantation dose. Similarly, further implantation doses may be implanted subsequently. It may be possible to form the absorption layer in two, three, four or five subsequent implantation steps. For example, the surface defects of the surface of the silicon carbide wafer may be reduced after one or more (e.g. after each) of the implantation steps.

For example, the ions with the first implantation dose may be implanted through a first surface of the silicon carbide wafer and, after implanting the ions with the first implantation dose, a process step may be performed to reduce the crystal defects of the first surface. For obtaining the wafer surface with reduced near surface crystal defects or increased crystal quality, various methods or processes may be used.

For example, after implanting the ions with the first implantation dose, the silicon carbide wafer (e.g. at least the first surface of the silicon carbide wafer) may be annealed to obtain the wafer surface with reduced near surface crystal defects. An annealing temperature for annealing the silicon carbide wafer may be at least 1600° C. (or at least 1650° C., at least 1700° C., at least 1750° C., or at least 1800° C.) and/or at most 1850° C. (or at most 1800° C., at most 1750° C., or at most 1700° C.). The first surface may be annealed between implanting ions with the first implantation dose and ions with the second implantation dose, for example. An annealing time, e.g. the time of exposing the wafer surface to the annealing temperature, may be more than 1 min. (or more than 2 min., more than 3 min., or more than 5 min.) and/or less than 7 min. (or less than 5 min., or less than 4 min.) for example, e.g. the annealing time may be 3 min. After annealing, the defect density may be lower than before annealing, e.g. below a critical defect density that allows growing a high quality epitaxial layer, for example.

For example, annealing the silicon carbide wafer to obtain the wafer surface with reduced near surface crystal defects may be performed in an annealing chamber. For example, the silicon carbide wafer may be annealed by laser annealing. Laser annealing may enable shorter annealing times, for example. For example, the annealing of the surface near implant damage layer may be carried out by non-melt mode laser annealing.

According to an example, the ions with the first implantation dose may be implanted with a first implantation energy and the ions with the second implantation dose may be implanted with a second implantation energy. The second implantation energy may differ from the first implantation energy by at least 5% (or at least 7%, at least 9%, at least 15% or at least 20%) and/or by at most 40% (or at most 30%, at most 20%, or at most 10%) of the first implantation energy. Implanting the ions with different implantation energies may enable to form an absorption layer with a larger thickness. By varying the implantation energies in the different implantation steps, the generated damage (e.g. surface defects due to implantation) may be reduced more efficiently (e.g. in the process step for obtaining the wafer surface with reduced near surface crystal defects), for example.

Forming the absorption layer by implanting 110 ions with two or more implantation steps and with at least one intermediate step may enable to implant ions and to anneal the silicon carbide wafer in a sequential way. For example, only a portion of the required dose (e.g. to obtain a predefined absorption coefficient of the absorption layer) may be implanted in each step, followed by annealing (e.g. furnace annealing procedure) for curing near surface damage or near surface defects, whereas e.g. the stable crystal defect centers in the absorption layer (e.g. needed to obtain the high absorption coefficient) may remain.

Alternatively or additionally, obtaining the wafer surface with reduced near surface crystal defects or lower defect density may comprise forming a silicon carbide layer on a first side of the silicon carbide wafer (e.g. a first surface at a front side of the silicon carbide wafer) after implanting the ions with the first implantation dose from the first side (e.g. through the first surface). For example, before forming the silicon carbide layer, a defect density of the first surface of the silicon carbide wafer may be at a critical limit for forming a high quality silicon carbide layer. After forming the silicon carbide layer, the surface of the silicon carbide layer provides the surface of the silicon carbide wafer. As the silicon carbide layer may have a lower defect density than a layer (e.g. with a thickness of the silicon carbide layer) at the surface of the silicon carbide wafer without the silicon carbide layer, the surface or a layer at the surface of the silicon carbide wafer may have a lower or reduced defect density after forming the silicon carbide layer. When implanting the ions with the second implantation dose, new defects may occur at the surface with the reduced defect density due to the implantation; however it may still be possible to e.g. form a further silicon carbide layer (e.g. an epitaxial layer) on the surface, for example. In a process sequence performing subsequent ion implantation and epitaxial growth, for example, a reduction of surface damage may be achieved by the silicon carbide layer formed on the surface e.g. still suitable for high quality epitaxial growth.

When forming a silicon carbide layer on the first side (e.g. the first surface) before implanting the ions with the second implantation energy, it may be necessary to implant the ions of the second implantation dose with a higher implantation energy than ions of the first implantation dose, e.g. in order to implant the ions in a same region of the silicon carbide wafer, e.g. the absorption layer. The implantation energies may be adapted accordingly, e.g. to reach the new target implantation depth taking into account the formed silicon carbide layer. For example, the increase of the second implantation energy in relation to the first implantation energy may depend on the thickness of the formed silicon carbide layer. Alternatively, the first and second implantation energies may be at least substantially equal, in order to form an absorption layer with an increased thickness, for example. For example, the surface may stay intact and the absorption layer may be spread over a larger vertical range in the silicon carbide wafer.

For example, forming the silicon carbide layer may comprise epitaxially growing a silicon carbide layer on the surface of the first side or depositing the silicon carbide layer by chemical vapor deposition on the surface of the first side. Using chemical vapor deposition for forming the silicon carbide layer may enable fast formation of the silicon carbide layer at low cost.

For example, the formed silicon carbide layer may have a thickness of at least 20 nm (or at least 50 nm, at least 100 nm, at least 200 nm, at least 300 nm, or at least 500 nm) and/or of at most 700 nm (or at most 500 nm, at most 300 nm, at most 200 nm, or at most 150 nm).

For example, if two or more (e.g. three) implantation processes with two or more intermediate processes for obtaining the wafer surface with reduced near surface crystal defects are used for implanting 110 the ions to form the absorption layer, a first of the at least two intermediate processes may be annealing and a second of the at least two intermediate processes may be layer growth. For example, both annealing and layer growth may be performed between a first and a subsequent second implantation process.

For example, processing the silicon carbide wafer may comprise forming a porous silicon carbide layer at a first side (e.g. the front side) of the silicon carbide wafer. The porous silicon carbide layer may be formed within the silicon carbide wafer or on a surface of the silicon carbide wafer, for example. Forming the porous silicon carbide layer may enable to increase the absorption coefficient of the absorption layer and/or to provide the surface of the silicon carbide wafer with a defect density at or below a critical limit that may allow growing a high quality epitaxial layer on the surface of the first side, e.g. after forming the porous silicon carbide layer.

The porous silicon carbide layer may be formed in the silicon carbide wafer, for example, by anodization, e.g. in an electrolyte comprising fluorine. The electrolyte may comprise hydrofluoric acid (HF) and/or ethanol. Anodization electrochemically decomposes, to a certain extent, the silicon carbide crystal in the region of the porous silicon carbide layer. Instead of uniformly decomposing the silicon crystal, electrochemical decomposition may locally remove silicon atoms out of the silicon carbide crystal lattice, forming small holes or pores within the silicon carbide crystal. For example, the crystal structure of the silicon carbide wafer outside the porous silicon carbide layer may remain unaffected by the anodization.

The porous silicon carbide layer may be formed by anodization between the surface of the first side (e.g. the front side surface) and a base region of the silicon carbide wafer (e.g. at the back side) that may be unaffected by the anodization. The porous silicon carbide layer may be formed by anodic etching of at least a part of the surface of the silicon carbide wafer, for example, by anodic etching in hydrofluoric acid (HF). The porous silicon carbide layer may be formed by electrochemical or photo-electrochemical etching of the semiconductor substrate.

A porosity of the porous silicon carbide layer may be measured as a ratio of the effective pore volume (e.g. volume of the pores) in the porous silicon carbide layer to the total volume of the porous silicon carbide layer (including the silicon carbide wafer volume and pore volume within the porous silicon carbide layer). For example, a higher porosity value may indicate a higher density of pores or a higher pore volume in the porous silicon carbide layer, whereas a lower porosity value may indicate a lower density of pores or a lower pore volume in the porous silicon carbide layer. For example, the porous silicon carbide layer may have a porosity between 5% and 95% (or between 10% and 80%, or between 25% and 60%), for example. For example, the silicon carbide layer may have a density (weight per volume) of about 90%, 80% or 70% of the silicon carbide material of the silicon carbide wafer surrounding the porous silicon carbide layer.

For example, the ions may be implanted 110 through at least a part (e.g. a vertical portion) of the porous silicon carbide layer. For example, the porous silicon carbide layer may be formed before implanting 110 ions to form the absorption layer. The absorption layer may be formed within the porous silicon carbide layer (e.g. the absorption layer may be formed completely within the porous silicon carbide layer) and ions may be implanted through a first vertical portion of the porous silicon carbide layer. For example, at least a first vertical portion of the absorption layer may be formed below the porous silicon carbide layer, e.g. the porous silicon carbide layer may be positioned vertically between the surface of the silicon carbide wafer the ions are implanted through, and the first vertical portion of the absorption layer.

Implanting 110 the ions for forming the absorption layer through the porous silicon carbide layer may increase the depth of the implantation (e.g. increased distance between the surface of the silicon carbide wafer and the absorption layer), whereas the surface damage may be kept close to its intrinsic value for the implantation dose applied, for example. Consequently, the distance of the absorption layer and e.g. an electrically active device layer of the silicon carbide wafer (e.g. formed after forming the absorption layer and before splitting the silicon carbide wafer) may be increased and e.g. less interaction during splitting (e.g. by irradiation with light, e.g. laser) with the active part of the device may occur.

As mentioned, the absorption layer or at least a vertical portion of the absorption layer may be formed within the porous silicon carbide layer. Implanting the absorption layer into a porous layer of silicon carbide may increase the absorption capability of this layer (e.g. may result in a higher absorption coefficient), e.g. enabling a combination of mechanical and electrical/optical active light absorption centers. For example, splitting (e.g. by light irradiation, e.g. laser) may be enabled with a lower implantation dose (e.g. a combined implantation dose to form the absorption layer), resulting in lower surface damage and consequently a surface quality appropriate for epitaxial growth.

For example, the porous silicon carbide layer may be formed after forming the absorption layer. The porous silicon carbide layer may vertically extend at least into a region of the silicon carbide wafer comprising the absorption layer. An implantation dose for forming the absorption layer may be a critical dose, e.g. at most $1.35 \cdot 10^{16}$ cm$^{-2}$, when implanting nitrogen atoms, when the porous silicon carbide layer is formed after the absorption layer, for example. The implantation dose used for forming the absorption layer may lead to surface defects that still allow high quality epitaxial growth on the surface, for example. By forming the porous silicon carbide layer after forming the absorption layer, an absorption coefficient of the absorption layer may be further increased, for example without generating further implantation defects at the surface. For example, after forming the porous silicon carbide layer the absorption coefficient of the absorption layer may be higher than before forming the porous silicon carbide layer.

Ion implantation into the silicon carbide wafer prior to a porosification process (e.g. forming the porous silicon carbide layer) may enable to adapt the porosification intensity (e.g. porosity) and/or depth profile of the porous silicon carbide layer. This may increase the absorption coefficient (e.g. higher absorption of irradiated light) in the absorption layer and/or may result in a better surface quality for epitaxial growth at a sufficiently high absorption coefficient in the absorption layer and/or may have a beneficial effect of the development of the porous layer (e.g. the porous silicon carbide layer) due to thermal budget of further processing of the silicon carbide wafer (e.g. epitaxial growth, activation anneal, etc.).

For example, before growing an epitaxial layer on the porous silicon carbide layer, a surface layer (e.g. thin surface layer) of the porous silicon carbide layer may be transformed or converted into a non-porous silicon carbide layer (e.g. so-called skin layer or start layer). In addition or as an alternative, the porosification may be performed such that a non-porous silicon carbide layer remains at the surface. The quality of an epitaxial layer grown on a non-porous silicon carbide layer may be higher than a quality of an epitaxial layer grown on a porous silicon carbide layer, for example.

For example, the porous silicon carbide layer may be formed with at least two layers, e.g. vertically adjacent to each other, with different porosities. The porosity of the upper layer (e.g. providing the surface of the silicon carbide wafer) may be chosen in a way allowing a suitable skin layer to be formed on the surface, e.g. prior to growing an epitaxial layer on the surface of the silicon carbide wafer. For example, after forming the absorption layer, a surface layer of the porous silicon carbide layer may be transformed into a non-porous silicon carbide layer. For example, the surface layer transformed into the non-porous silicon carbide layer may be the skin layer and may be used as start layer for growing an epitaxial layer, for example.

For transforming the surface layer of the porous silicon carbide layer into a non-porous crystalline start layer, the surface layer of the porous silicon carbide layer may be heated, e.g. in a reducing atmosphere comprising hydrogen. The heat treatment may result in a rearrangement of the silicon carbide atoms in a thin layer along the exposed surface of the porous silicon carbide layer, wherein the atoms in the thin surface layer of the porous silicon carbide layer may re-order in a reflow process to form a continuous non-porous crystalline start layer, for example having a high crystal quality. Alternatively or additionally, the non-porous crystalline start layer may be formed by epitaxial growth on the porous silicon carbide layer or by laser annealing causing rearrangement of the atoms on the surface of the porous silicon carbide layer.

The non-porous crystalline start layer may be used as base for growing an epitaxial layer. As the non-porous crystalline start layer may have a high crystal quality, the epitaxial layer may grow with high crystal quality on the non-porous crystalline start layer. For example, the epitaxial layer grown on the non-porous crystalline start layer may have a crystal defect density comparable to epitaxial layers grown directly on conventional non-porous single crystal silicon carbide wafer. For example, the non-porous crystalline start layer with the grown epitaxial layer may be used as substrate to form structures of semiconductor devices, as will be described later.

For example, the porous silicon carbide layer may have a thickness of at least 0.3 µm (or of at least 0.5 µm, of at least 0.8 µm, or of at least 1.2 µm) and/or of at most 3 µm (or of at most 2 µm, or of at most 1.5 µm).

For example, the porous silicon carbide layer may limit penetration of critical defects from a substrate of the silicon carbide wafer (e.g. between a back side surface of the silicon carbide wafer and the porous silicon carbide layer) into a drift zone of a device of the silicon carbide wafer (e.g. formed after forming the absorption layer and before splitting the silicon carbide wafer) so that the defect density and/or detrimental bipolar degradation effects in the drift zone may be at least reduced.

By using at least one of the concepts proposed above or below, it may be possible to provide a method for increasing an implant-induced absorption layer efficiency, e.g. for wafer splitting applications, in particular with so-called cold split. For example, proposed methods may enable to decrease surface layer damage, e.g. of a surface of a semiconductor wafer (e.g. a SiC wafer), to enable good (e.g. proper) epitaxial growth, e.g. SiC epitaxial growth, e.g. prior to the splitting. Concepts are proposed to increase the absorption efficiency by several ways, e.g. at the same time still enabling epitaxial growth at the surface with a good quality of the epitaxial layer with an uncritical defect density. Concepts are proposed to limit crystal damage creation during implantation 110 of ions, e.g. for forming the absorption layer.

Proposed aspects relate to methods to improve implant-induced absorption layer efficiency with reduced SiC surface layer damage. For example, it may be possible to reduce the SiC surface layer damage to enable proper SiC epitaxial growth, e.g. prior to front-side processes and/or the splitting process.

Additionally, by increasing the implantation dose for forming the absorption layer, it may be possible to limit wafer bow and/or wafer warp. For example, when implanting ions with a higher implantation dose, it may be possible to decrease wafer bow and/or wafer warp. For example, when implanting ions into a semiconductor wafer with an initial center bow before the implantation of ions of between 3 µm and −14 µm, a final center bow after the implantation of ions may be between −180 µm and −450 µm, depending on the used implantation dose. In general, a higher implantation dose may result in a higher convex center bow. Specifically, with an implantation dose of $0.9 \cdot 10^{16}$ $cm^{-2}$ a center bow after implantation may be −427 µm; with an implantation dose of $2.25 \cdot 10^{16}$ $cm^{-2}$ the center bow after implantation may be −268 µm; and/or with an implantation dose of $2.7 \cdot 10^{16}$ $cm^{-2}$ the center bow after implantation may be −205 µm (e.g. the negative numbers indicate a convex bow). For example, when implanting ions into a semiconductor wafer with an initial total warp before the implantation of ions of between 20 µm and 35 µm, a final total warp after the implantation of ions may be between 200 µm and 480 µm, depending on the implantation dose used. Specifically, with an implantation dose of $0.9 \cdot 10^{16}$ $cm^{-2}$ a total warp after implantation may be 457 µm; with an implantation dose of $2.25 \cdot 10^{16}$ $cm^{-2}$ the total warp after implantation may be 293 µm; and/or with an implantation dose of $2.7 \cdot 10^{16}$ $cm^{-2}$ the center bow after implantation may be 231 µm.

As center bow and/or total warp may be increased after implantation, wafer handling issues at non-manual processing may arise and it may be difficult to carry out a volume production with such process. Therefore, it may be necessary to provide methods for decreasing the center bow and/or total warp after the implantation. By providing concepts to increase the implantation dose (e.g. while still enabling a good surface quality for epitaxial growth), due to the higher implantation dose, wafer bow and/or total warp may decrease and e.g. automated wafer handling may be enabled. For example, also intermediate annealing steps (e.g. between two implantation steps with a first and a second implantation dose) may decrease the wafer bow, e.g. of SiC wafers.

According to examples, processing the silicon carbide wafer may further comprise removing, from a first side (e.g. the front side) of the silicon carbide wafer, a surface layer of the silicon carbide wafer. A thickness of the surface layer may extend from a first surface (e.g. front side surface) of the silicon carbide wafer into the silicon carbide wafer. The surface layer may be in direct contact with and/or may comprise the first surface. The surface layer may have a thickness of less than 100 nm (or less than 95 nm, less than 90 nm or less than 80 nm) and/or of more than 50 nm (or more than 70 nm, or more than 85 nm). The ions may be implanted 110 from the first side and the surface layer may be removed after implanting the ions 110 and before splitting 120 the silicon carbide wafer.

For example, the surface layer may be removed from the first side by etching the first side of the silicon carbide wafer. For example, after removing the surface layer, an epitaxial layer may be grown on the surface of the first side of the silicon carbide wafer, as e.g. described above or below.

For example, after removing the surface layer from the first side of the silicon carbide wafer, a maximal vacancy concentration (e.g. surface vacancy concentration) within a layer at the first side of the silicon carbide wafer may be at most $3 \cdot 10^{22}$ cm$^{-3}$ (or at most $2 \cdot 10^{22}$ cm$^{-3}$, or at most $1 \cdot 10^{22}$ cm$^{-3}$). The layer may have a thickness of between 5 nm and 20 nm, e.g. of 10 nm, and a thickness of the layer extends from the surface of the silicon carbide wafer into the silicon carbide wafer. The vacancy concentration of the layer may be an averaged vacancy concentration of the layer, for example. The layer may be a layer with higher defect density in comparison to the removed surface layer. For example, the near-surface region of the silicon carbide wafer has a relatively low near surface defect density, e.g. vacancy concentration, of at most $3 \cdot 10^{22}$ cm$^{-3}$ after removing the surface layer. The low near surface defect density may enable growth of a high quality epitaxial layer on the surface of the silicon carbide wafer, for example. The defect concentration of the removed surface layer may be lower than the defect concentration of the layer (e.g. the 10 nm thick layer). However, in epitaxial growth processes, e.g. pre-etch prior to epitaxial growth may be required and the surface layer may be removed (e.g. the surface layer may have a thickness of 90 nm). Therefore, the critical defect density may be considered to be the one in about 100 nm depth of the silicon carbide wafer including the surface layer, for example.

For example, the ions may be implanted 110 with an implantation dose higher than an amorphous dose necessary for amorphization of silicon carbide material of the absorption layer. For example, if the ions are implanted in subsequent implantation processes, e.g. with a first and a second implantation dose, in each of the subsequent implantation processes the implantation dose may be higher than the amorphous dose. For example, the implanted ions may disturb a crystal structure within the silicon carbide material of the silicon carbide wafer, and/or may result in an amorphous region within the silicon carbide wafer. Here, the crystal structure of the silicon carbide wafer may correspond to one of the polymorphs of silicon carbide.

Further, the silicon carbide wafer may be annealed after implanting 110 the ions. This may result in partial or full recrystallization of the amorphous region, which may result in a crystal structure different from a crystal structure of the silicon carbide material of the silicon carbide wafer outside the absorption layer. For example, the different crystal structures may result in different band gaps of the absorption layer and the silicon carbide material of the silicon carbide wafer outside the absorption layer so that the wavelength-dependent absorption coefficients of the absorption layer and of the silicon carbide material outside the absorption layer have maxima at different wavelengths depending on the band gaps. In other words, the different crystal structures may result in different absorption bands of the absorption layer and of the silicon carbide material outside the absorption layer. In other semiconductor materials, e.g. silicon, it might not be possible to increase an absorption coefficient by providing a different crystal structure. Further, annealing the silicon carbide wafer, e.g. after implanting 110 ions for forming the absorption layer, may reduce surface defects of the surface of the silicon carbide wafer through which the ions are implanted.

For example, the absorption layer may have a 3C-crystal structure. For example, silicon carbide material of the absorption layer may have the 3C-crystal structure. The silicon carbide material of the silicon carbide wafer surrounding the absorption layer may have a 4H, 6H or 15R-crystal structure.

Additionally or alternatively, the ions may be implanted 110 into the silicon carbide wafer with an implantation dose higher than a solubility of the silicon carbide material of the silicon carbide wafer. For example, the used implantation dose may cause precipitation (or segregation) within the absorption layer. For generating segregation or precipitation, the silicon carbide wafer may be annealed after implanting 110 the ions. For example, due to annealing the silicon carbide wafer, the implanted ions may react with each other and with ions of the silicon carbide material of the silicon carbide wafer to form segregations. The segregation of the implanted ions may cause the higher absorption coefficient of the absorption layer compared to the silicon carbide material outside the absorption layer, for example.

For example, the implanted ions may be at least one of nitrogen (N) ions, vanadium (V) ions, boron (B) ions, argon (Ar) ions, carbon (C) ions, nickel (Ni) ions, silicon (Si) ions, titanium (Ti) ions, tantalum (Ta) ions, molybdenum ions, tungsten ions and aluminum (Al) ions. The implanted ions may integrate into the crystal lattice of the silicon carbide material of the silicon carbide wafer within the absorption layer to form an absorption barrier for the light of the target wavelength. For example, nitrogen (N) ions, vanadium (V) ions, boron (B) ions, argon (Ar) ions, carbon (C) ions, nickel (Ni) ions, silicon (Si) ions and/or titanium (Ti) ions may form a strong absorption band after their integration into the SiC crystal lattice. For example, aluminum ions, tantalum ions, boron ions, titanium ions and/or nickel ions may be implanted 110 into the silicon carbide wafer and the silicon carbide wafer may be annealed after implanting 110 the ions. For example, ions (e.g. phosphor ions) may be implanted with an implantation dose of at least $2 \cdot 10^{15}$ cm$^{-2}$ (or at least $1 \cdot 10^{16}$ cm$^{-2}$ or at least $5 \cdot 10^{16}$ cm$^{-2}$). For example, nitrogen ions may be used, which may result in low damages at the implantation surface in comparison to other ions, for example. For the case that the implanted ions are donors or acceptors, the resulting locally enhanced charge carrier density can support the absorption process, in particular in the case of the use of high implantation doses.

For example, a thickness of the absorption layer may be at least 30 nm (or at least 50 nm, at least 100 nm, at least 200 nm, or at least 300 nm) and/or at most 1500 nm (or at most 750 nm, at most 500 nm, or at most 400 nm). In a typical embodiment, the thickness of the absorption layer is at least 100 nm and at most 500 nm. For example, a thinner absorption layer may result in less variation of the thickness of the silicon carbide device wafer. For example, a surface roughness of a surface of the silicon carbide device wafer may be less than 1 μm (or less than 500 nm, or less than 200 nm) after splitting 120 the silicon carbide wafer. In another example, the surface roughness of the surface of the silicon carbide device wafer may be less than 20 μm. In general, the surface roughness may be smaller than the thickness of the absorption layer. The surface with said surface roughness may be opposite to a front side of the silicon carbide device wafer and may, for example, comprise a remaining part of the absorption layer. Said surface roughness may be existent directly after splitting 120 the silicon carbide wafer (e.g. without subsequent polishing). The surface roughness may be reduced with further processing, for instance, with surface polishing.

For example, the absorption layer may be formed within the silicon carbide wafer at a distance, e.g. a vertical distance, to a surface of the silicon carbide wafer of at least 300 nm (or at least 500 nm, at least 1000 nm, or at least 2000 nm) and/or at most 5 µm (or at most 4 µm, or at most 3 µm). The distance may be achieved by controlling the implantation energy of implanting 110 the ions. The thickness of the silicon carbide device wafer may be controlled based on the selected distance between the surface of the silicon carbide wafer and the absorption layer.

For example, the target wavelength may be at least 100 nm (or at least 200 nm, at least 400 nm, at least 500 nm, at least 600 nm, at least 700 nm, at least 750 nm, at least 1.0 µm, or at least 1.25 µm or at least 1.5 µm) and/or at most 3.5 µm (or at most 2 µm, at most 1.6 µm, at most 1.1 µm, at most 750 nm, at most 650 nm, or at most 550 nm). In a typical embodiment, the target wavelength may be at least 300 nm and at most 600 nm. For example, the target wavelength may be between 370 nm and 430 nm (or between 390 nm and 410 nm, e.g. 395 nm, 400 nm, or 405 nm) or between 620 nm and 720 nm. For example the target wavelength is higher than 500 nm, e.g. between 500 nm and 800 nm. It is possible that the target wavelength corresponds to the bandgap of the material of the absorption layer, for instance within ±1 GHz. In a typical example, the target wavelength should be low enough to ensure energy deposition into the absorption layer, but high enough to allow for high transmission in the material outside the absorption layer. For example, if the absorption layer has a 3C-crystal structure, the bandgap may be 3.2 eV, corresponding to a target wavelength of approximately at least 350 nm to at most 400 nm, in particular 388 nm.

The light of the target wavelength used for splitting 120 may be laser light. An energy density of the light of the target wavelength may be at least $0.5$ J/cm$^2$, e.g. 1 J/cm$^2$, and at most 100 J/cm$^2$, e.g. at most 10 J/cm$^2$. Such an energy density might be high enough to allow for chemical decomposition of the absorption layer. For example, the light of the target wavelength may be pulsed laser light and/or unfocused laser light. Using unfocused laser light may enable reducing a complexity of a light source or optical system for irradiating and splitting 120 the silicon carbide wafer, e.g. compared to other splitting concepts using focused laser light. The pulsed laser light may have a pulse length of at most 100 ns, for example at most 10 ns.

For example, at least 5% (or at least 7%, at least 10% or at least 15%) of the light of the target wavelength penetrating through the silicon carbide material of the silicon carbide wafer outside the absorption layer and/or impinging on the absorption layer may be absorbed by the absorption layer. A further percentage of the light of the target wavelength may be absorbed by the material outside the absorption layer. In a typical example, at least 20% of the light of the target wavelength impinging on the absorption layer is absorbed. The high absorption within the absorption layer (which may be caused by the high absorption coefficient in combination with the thickness of the absorption layer) may enable reducing an impact of the light of the target wavelength on regions of the silicon carbide wafer outside the absorption layer, e.g. behind the absorption layer.

For example, the light of the target wavelength may be irradiated from a first side (e.g. back side) of the silicon carbide wafer and may be absorbed almost completely within the absorption layer and material of the silicon carbide wafer between the absorption layer and the first side, so that the light of the target wavelength might not alter regions of the silicon carbide wafer located between the absorption layer and a surface of a second side (e.g. front side) of the silicon carbide wafer and/or structures (e.g. metallization structures) located on the second side of the silicon carbide wafer.

According to at least one example, the method 100 may further comprise at least one of the following additional method steps (i)-(iii): (i) heating the silicon carbide wafer, (ii) applying mechanical stress and/or force to the silicon carbide wafer, and (iii) ultrasonic treatment of the silicon carbide wafer. The at least one additional method step (i)-(iii) may be applied during and/or after irradiating the silicon carbide wafer with the light of the target wavelength. The at least one additional method step (i)-(iii) may be particularly applied for splitting 120 the silicon carbide wafer. For example, heating or annealing the silicon carbide wafer (optional step (i)) may facilitate splitting 120 the silicon carbide wafer, e.g. by introducing thermomechanical stress at the absorption layer to support splitting 120 the silicon carbide wafer. Mechanical force and/or stress (optional step (ii)) may be applied, for example, by forming an additional layer on the silicon carbide wafer, which additional layer may be mechanically pre-stressed (e.g., twisted and/or tensioned) with respect to the silicon carbide wafer. In addition or as an alternative, applying mechanical force and/or stress in optional step (ii) may involve applying compressed gas or compressed air to a side face of the wafer. Ultrasonic treatment (optional step (iii)) may comprise applying ultrasonic radiation to the silicon carbide wafer. Ultrasonic treatment may also result in heating the silicon carbide wafer, analogue to optional step (i).

For example, the absorption layer may be irradiated through a back side of the silicon carbide wafer. For example, the light of the target wavelength may be irradiated onto the back side of the silicon carbide wafer, and may be transmitted through a region of the silicon carbide wafer between the back side and the absorption layer to the absorption layer. Irradiating the light of the target wavelength from the back side may result in avoiding impacts to structures at the front side of the silicon carbide wafer by the irradiated light. Thus, it may be possible to form structures, e.g. metallization structures of a silicon carbide semiconductor device, at the front side of the silicon carbide wafer before splitting 120 the silicon carbide wafer. Splitting 120 the silicon carbide wafer after forming a silicon carbide semiconductor device may facilitate forming a thin silicon carbide semiconductor device as structures of the silicon carbide semiconductor device may be formed already on a the silicon carbide wafer before splitting the wafer to obtain the thinner device wafer.

For example, a carrier structure (e.g. carrier wafer) may be provided at the front side of the silicon carbide wafer before splitting the silicon carbide wafer. Placing or attaching the carrier structure at the front side may facilitate handling of the silicon carbide device wafer and/or provide mechanical support to the silicon carbide device wafer, for example.

According to an example, the method 100 may further comprise forming a further absorption layer within the remaining silicon carbide wafer. The further absorption layer may be formed by implanting ions into the remaining silicon carbide wafer, e.g. according to forming the absorption layer within the silicon carbide wafer as described herein. The method 100 may further comprise splitting the remaining silicon carbide wafer along the further absorption layer, e.g. analogously to splitting 120 the silicon carbide wafer as described herein. By the further splitting, further silicon carbide device wafers may be obtained. In other words, a reuse of the remaining silicon carbide wafer may be enabled. For example, it may be enabled to form a plurality of silicon carbide device wafers while preventing high consumption of silicon carbide material for splitting the respective silicon carbide device wafers.

For example, a net doping concentration of the silicon carbide wafer may be at most $2 \cdot 10^{19}$ cm$^{-3}$ (or at most $5 \cdot 10^{18}$ cm$^{-3}$, or at most $1 \cdot 10^{18}$ cm$^{-3}$) and/or at least $1 \cdot 10^{17}$ cm$^{-3}$ (or at least $5 \cdot 10^{17}$ cm$^{-3}$). Here, the used doping atoms may be nitrogen atoms and/or phosphorus atoms. The net doping concentration may be an average net doping concentration of silicon carbide material of the silicon carbide wafer outside the absorption layer, for example. Alternatively, a net doping concentration of the silicon carbide wafer may be at most $1 \cdot 10^{15}$ cm$^{-3}$ (so-called nominally undoped silicon carbide).

For example, the method 100 may be used for forming silicon carbide semiconductor devices. The method 100 may further comprise growing an epitaxial layer on a front side of the silicon carbide wafer. The epitaxial layer may be grown or deposited before splitting the silicon carbide wafer. For example, if a porous silicon carbide layer is formed at the front side surface of the silicon carbide wafer, before growing the epitaxial layer on the front side, a non-porous skin layer, e.g. a non-porous crystalline start layer, may be formed at the surface of the porous silicon carbide layer and the epitaxial layer may be grown on the non-porous crystalline start layer. For example, the epitaxial layer may be homoepitaxial with respect to a semiconductor material of the silicon carbide wafer at the front side of the silicon carbide wafer. The epitaxial layer may be a silicon carbide layer. For example, the epitaxial layer may have a thickness of at least 3 µm (or of at least 5 µm, of at least 10 µm, or of at least 20 µm) and of at most 300 µm (or of at most 200 µm or at most 100 µm or at most 50 µm, or at most 30 µm). The epitaxial layer may define at least one of a drain zone, a buffer zone, a backside emitter and a drift zone of a silicon carbide semiconductor device.

For example, the method 100 may further comprise forming a metallization structure at a front side of the silicon carbide wafer before splitting the silicon carbide wafer. The metallization structure may be formed on the epitaxial layer, for example. The metallization structure (e.g. source metallization or gate wiring structure) may be a metallization structure of a silicon carbide semiconductor device to be formed, for example.

For example, one or more silicon carbide semiconductor devices may be formed on the silicon carbide wafer. For example, each silicon carbide semiconductor device may comprise or may be a transistor. At least one of a gate trench, and a gate electrode of the transistor may be formed before splitting 120, for example. It may be possible to split 120 the silicon carbide wafer after forming all structures of the silicon carbide semiconductor device at the front side of the silicon carbide wafer. For example, the silicon carbide device wafer may be diced (e.g. by sawing) to obtain a plurality of silicon carbide devices.

The transistor may be a field effect transistor (e.g. a metal oxide semiconductor field effect transistor (MOSFET) or an insulated gate bipolar transistor (IGBT)) or a thyristor. The gate of the transistor may be located in a gate trench extending into a silicon carbide semiconductor substrate of the silicon carbide semiconductor device or may be located on a lateral surface of the silicon carbide semiconductor substrate. The transistor may comprise one or more transistor cells. For example, the silicon carbide semiconductor substrate may comprise one or more source regions, one or more body regions and a drift region of the transistor. The one or more source regions and the drift region may each be of a first conductivity type (e.g. n-doped). The one or more body regions may be of a second conductivity type (e.g. p-doped).

The transistor may be a vertical transistor structure conducting current between a front side surface of the silicon carbide semiconductor substrate and a back side surface of the silicon carbide semiconductor substrate. For example, the transistor of the silicon carbide semiconductor device may comprise a plurality of source doping regions connected to a source wiring structure, a plurality of gate electrodes or a gate electrode grid connected to a gate wiring structure and a back side drain metallization or back side collector metallization.

For example, the silicon carbide wafer may be either one of a silicon carbide base substrate, a silicon carbide base substrate with a silicon carbide epitaxial layer grown on the silicon carbide base substrate or a silicon carbide epitaxial layer. The silicon carbide wafer may be a monocrystalline silicon carbide wafer or may comprise at least a monocrystalline silicon carbide layer.

The front side of the silicon carbide wafer may be the side used to implement more sophisticated and complex structures (e.g. gates of transistors) than at the back side of the silicon carbide wafer. The process parameters (e.g. temperature) and the handling may be limited for forming structures at the back side to avoid altering of structures formed at the front side.

For example, the vertical dimension or vertical distance and the thickness of layers may be measured orthogonal to the front side surface of the semiconductor substrate and a lateral direction and lateral dimensions may be measured in parallel to the front side surface of the semiconductor substrate.

A silicon carbide semiconductor device to be formed on the silicon carbide wafer may be a power semiconductor device. The power semiconductor device or an electrical structure (e.g. transistor of the silicon carbide device or a diode) of the power semiconductor device may have a breakdown voltage or blocking voltage of more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

Above and below examples are described in connection with a silicon carbide wafer. Alternatively, a wide band gap semiconductor wafer may be processed, e.g. comprising a wide band gap semiconductor material different from silicon carbide. The wide band gap semiconductor wafer may have a band gap larger than the band gap of silicon (1.1 eV). For example, the wide band gap semiconductor wafer may be a silicon carbide (SiC) wafer, or gallium arsenide (GaAs) wafer, or a gallium nitride (GaN) wafer.

More details and aspects are mentioned in connection with the embodiments described above or below. Processing the wide band gap semiconductor wafer may comprise one or more optional additional features corresponding to one or more aspects mentioned in connection with the proposed concept or one or more embodiments described above or below.

Figure 2:
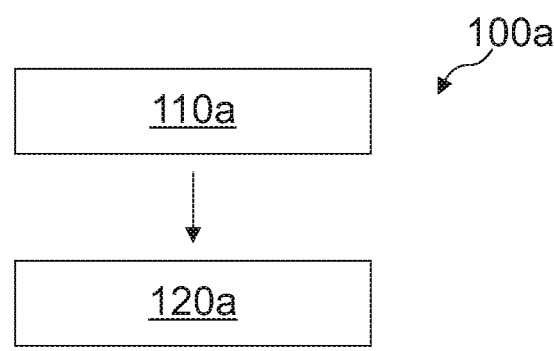
FIG. 2 shows a flow chart of a method for processing a silicon carbide wafer comprising implanting ions through a porous layer of the silicon carbide wafer.

FIG. 2 shows a flow chart of a method 100a for processing a silicon carbide wafer, e.g. comprising implanting ions through at least a portion of a porous layer of the silicon carbide wafer. The method 100a may comprise implanting 110a ions into the silicon carbide wafer through at least a portion of a porous silicon carbide layer of the silicon carbide wafer at a front side of the silicon carbide wafer to form an absorption layer in the silicon carbide wafer. The method 100a may further comprise splitting 120a the silicon carbide wafer along the absorption layer at least by irradiating the silicon carbide wafer with light of the target wavelength to obtain a silicon carbide device wafer and a remaining silicon carbide wafer.

For example, the porous silicon carbide layer of the silicon carbide wafer may be formed according to a method described above or below, before implanting 110a the ions. Implanting the ions through the porous silicon carbide layer may enable forming the absorption layer with an increased distance to the surface (e.g. front side surface) of the silicon carbide wafer. For example, fewer defects may occur at the surface of the silicon carbide wafer when implanting the ions through the porous silicon carbide layer. For example, when forming at least a portion of the absorption layer within the porous silicon carbide layer, the absorption coefficient of the absorption layer may be increased.

More details and aspects are mentioned in connection with the embodiments described above or below. The embodiments shown in FIG. 2 may comprise one or more optional additional features corresponding to one or more aspects mentioned in connection with the proposed concept or one or more embodiments described above or below (e.g. FIGS. 1 and 3-7h).

Figure 3:
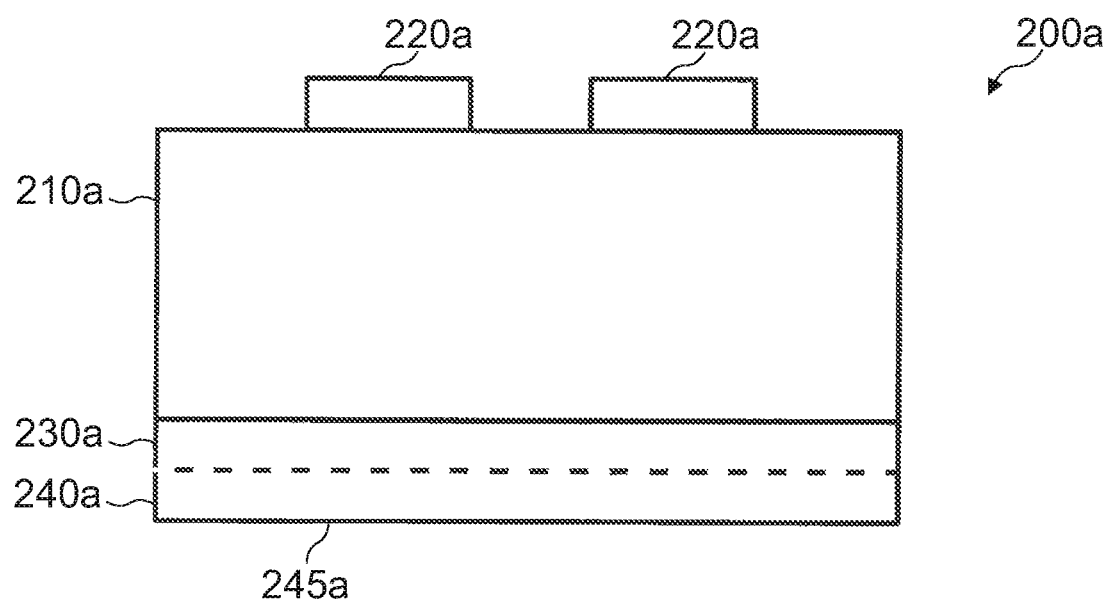
FIG. 3 shows a schematic cross section of a silicon carbide semiconductor device comprising a porous silicon carbide layer.

FIG. 3 shows a schematic cross-section of a silicon carbide semiconductor device 200a which may comprise a porous silicon carbide layer 230a. The silicon carbide semiconductor device 200a may further comprise a silicon carbide semiconductor substrate 210a, e.g. having a 4H-crystal structure, and a metallization structure 220a located at a front side of the silicon carbide semiconductor substrate 210a. The porous silicon carbide layer 230a may be located between the front side and a back side surface 245a of the silicon carbide semiconductor substrate 210a.

The silicon carbide semiconductor device 200a may be formed according to a method described above or below. For example, providing the porous silicon carbide layer 230a may enable improved manufacturing of the silicon carbide semiconductor device 200a.

For example, the silicon carbide semiconductor device 200a may comprise a back side layer 240a located at a back side of the silicon carbide semiconductor device 200a and providing the back side surface 245a. The back side layer may be a non-porous layer, for example. Alternatively, the porous silicon carbide layer may extend to the back side surface 245a of the silicon carbide semiconductor substrate. In other words, it is possible that the back side layer 240a is a porous layer.

For example, the back side silicon carbide layer 240a of the silicon carbide semiconductor substrate 200a may have a thickness of at least 50 nm and/or at least partly may have a 3C crystal structure. For example, the 3C crystal structure of the back side silicon carbide layer 240a may be caused by splitting the silicon carbide semiconductor device 200a from a silicon carbide wafer.

More details and aspects are mentioned in connection with the embodiments described above or below. The embodiments shown in FIG. 3 may comprise one or more optional additional features corresponding to one or more aspects mentioned in connection with the proposed concept or one or more embodiments described above or below (e.g. FIGS. 1-2 and 4-7h).

Figure 4:
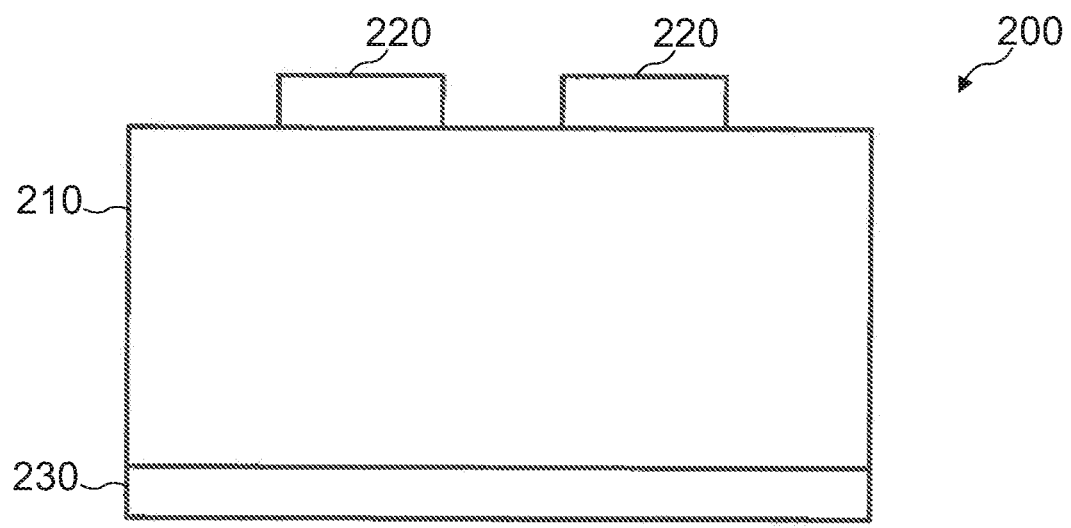
FIG. 4 shows a schematic cross section of a silicon carbide semiconductor device comprising a substrate having a 4H-crystal-structure and a back side layer having a 3C-crystal-structure.

FIG. 4 shows a schematic cross section of a silicon carbide semiconductor device 200. The silicon carbide semiconductor device 200 may comprise a silicon carbide semiconductor substrate 210, e.g. having a 4H-crystal structure. The silicon carbide semiconductor device 200 may further comprise a metallization structure 220 located at a front side of the silicon carbide semiconductor substrate 210.

For example, the silicon carbide semiconductor device 200 may comprise a back side silicon carbide layer 230 located at a back side surface of the silicon carbide semiconductor substrate 210. For example, the back side layer may have a thickness of at least 30 nm (or of at least 50 nm, of at least 100 nm, or of at least 150 nm) and/or of at most 300 nm (or of at most 200 nm, or of at most 150 nm). The back side silicon carbide layer 230 may have a 3C-crystal structure. For example, a thickness of the silicon carbide semiconductor substrate 220 may be higher than the thickness of the back side silicon carbide layer 230.

For example, the silicon carbide semiconductor device 200 may have been formed by using the method 100. A thickness of the silicon carbide semiconductor device 200 may be at most 300 µm (or at most 200 µm, or at most 100 µm or at most 50 µm or at most 20 µm), for example. The back side silicon carbide layer 230 may be a remaining part of the absorption layer, e.g. remaining at the back side of the remaining silicon carbide wafer after splitting the silicon carbide wafer. The thin back side silicon carbide layer 230 having the 3C-crystal structure might not have a significant influence on a parameter of the silicon carbide semiconductor device 200, e.g. compared to an influence of the silicon carbide semiconductor substrate 220 having the 4H-crystal structure. The contact resistance to a back side metallization may be reduced by this layer, e.g. due to the lower band gap and the higher defect/doping level.

More details and aspects are mentioned in connection with the embodiments described above or below. The embodiments shown in FIG. 4 may comprise one or more optional additional features corresponding to one or more aspects mentioned in connection with the proposed concept or one or more embodiments described above or below (e.g. FIGS. 1-3 and 5-7h).

Figure 5:
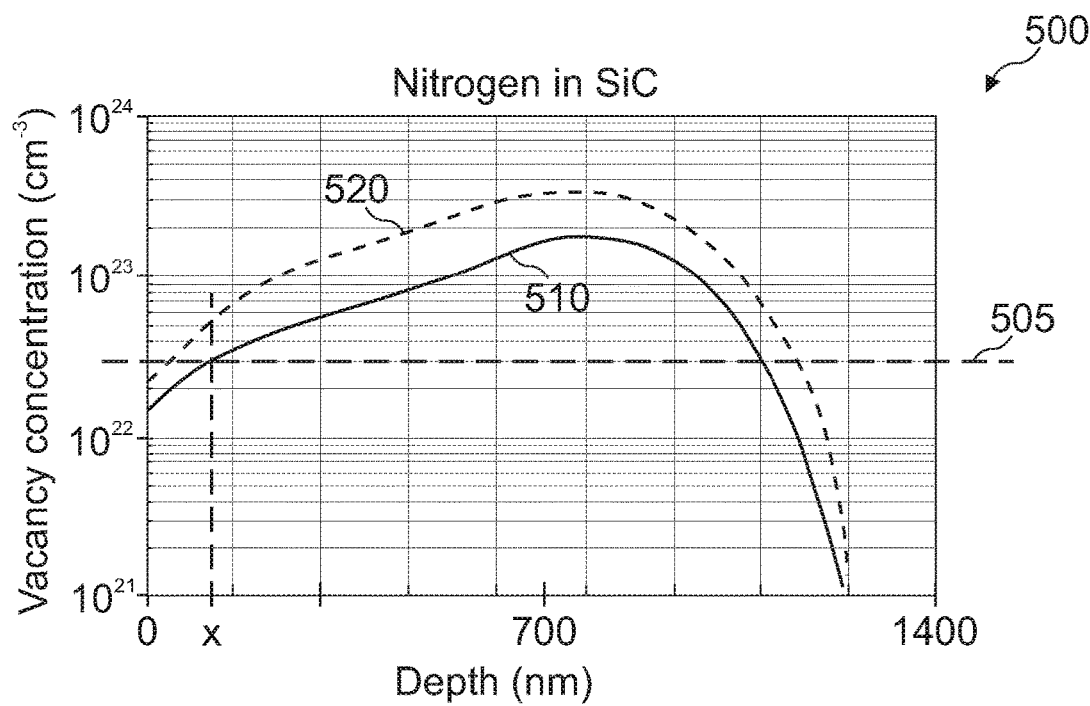
FIG. 5 shows a diagram schematically showing vacancy concentrations in dependence of the depth of the silicon carbide wafer.

FIG. 5 shows a schematic diagram 500 showing a first and a second vacancy concentration 510, 520 in dependence of the depth of a silicon carbide wafer (e.g. the vertical distance from the surface of the silicon carbide wafer). The vacancies or defects may be caused by implantation of ions for forming an absorption layer (e.g. in a region of the silicon carbide wafer comprising a maximum vacancy concentration).

A critical vacancy concentration 505 indicates a limit of defects or vacancies of a layer that allows high quality epitaxial growth on the layer. For example, nitrogen ions may be implanted with a first implantation dose (e.g. critical dose) resulting in the first vacancy concentration 510, and with a higher second implantation dose resulting in the second vacancy concentration 520. For example, at the surface of the silicon carbide wafer (depth of 0 nm), both vacancy concentrations 510, 520 are lower than the critical vacancy concentration 505.

However, before epitaxial growth, a surface layer of a thickness x, e.g. 90 nm, may be removed, resulting in an increased vacancy concentration at the surface (e.g. new surface) of the silicon carbide wafer, i.e. the vacancy concentration indicated at the depth x in diagram 500. As can be seen, the second vacancy concentration 520 is above the critical limit, hence possibly resulting in epitaxial growth with poor quality. However, the first vacancy concentration 510 that corresponds to the first implantation dose is at the critical limit, thus enabling growing a high quality epitaxial layer, for example. The first vacancy concentration 510 may be achieved by implanting nitrogen ions with a combined implantation dose (e.g. in three subsequent implantation steps) of $1.35 \cdot 10^{16}$ cm$^{-2}$, for example.

By using concepts proposed above or below it may be possible to reduce the vacancy concentration 520 at the surface region, e.g. from the depth of 0 nm to at least the depth x (e.g. 90 nm), when implanting the ions with the second implantation dose. For example, during implanting the ions with the second implantation dose, the silicon carbide wafer may be heated and/or the ions with may be implanted in subsequent steps (in combination resulting in the second implantation dose), wherein the surface defect density can be reduced between subsequent steps. As a result, also when implanting the ions with the second implantation dose (e.g. higher than the critical dose), a high quality epitaxial layer may be grown on the surface of the silicon carbide wafer after removing the surface layer.

For example, to obtain the first and second vacancy concentrations 510, 520, a silicon carbide wafer is implanted with nitrogen ions with three implantation steps with energies of e.g. 1200 keV, 1000 keV, and 800 keV, to enable a broader damage peak, for example. A proper epitaxial quality may be achieved up to an implantation dose of $1.35 \cdot 10^{16}$ cm$^{-2}$, whereas surface irregularities (e.g. leading to poor epitaxial growth) may start above an implantation dose of $1.35 \cdot 10^{16}$ cm$^{-2}$, e.g. they may occur at a dose of $1.80 \cdot 10^{16}$ cm$^{-2}$. From experiments and simulations of phosphorus (not shown) and nitrogen implanted wafers it can be deduced that a surface vacancy concentration of e.g. $3 \cdot 10^{22}$ cm$^{-2}$ may be a limit for proper epitaxial growth (e.g. independent of implanted species).

For example, when phosphorous atoms are implanted to form the absorption layer, a maximal implantation dose without severe impact on epitaxial quality (e.g. a quality of an epitaxial layer grown on the surface) may be $1.8 \; 10^{15}$ cm$^{-2}$, and when nitrogen atoms are implanted the maximal implantation dose may be $13.5 \; 10^{15}$ cm$^{-2}$. For example, stronger influence on absorption (e.g. a higher absorption coefficient) may be seen after a nitrogen implant (e.g. due to higher implantation dose) while conserving good surface morphology. For example, only in spectral regions of already pronounced absorption the absorption may be further increased, e.g. no new absorption edges (e.g. wavelength ranges with a high absorption coefficient) may be created.

More details and aspects are mentioned in connection with the embodiments described above or below. The embodiments shown in FIG. 5 may comprise one or more optional additional features corresponding to one or more aspects mentioned in connection with the proposed concept or one or more embodiments described above or below (e.g. FIGS. 1-4 and 6-7h).

Figure 6:
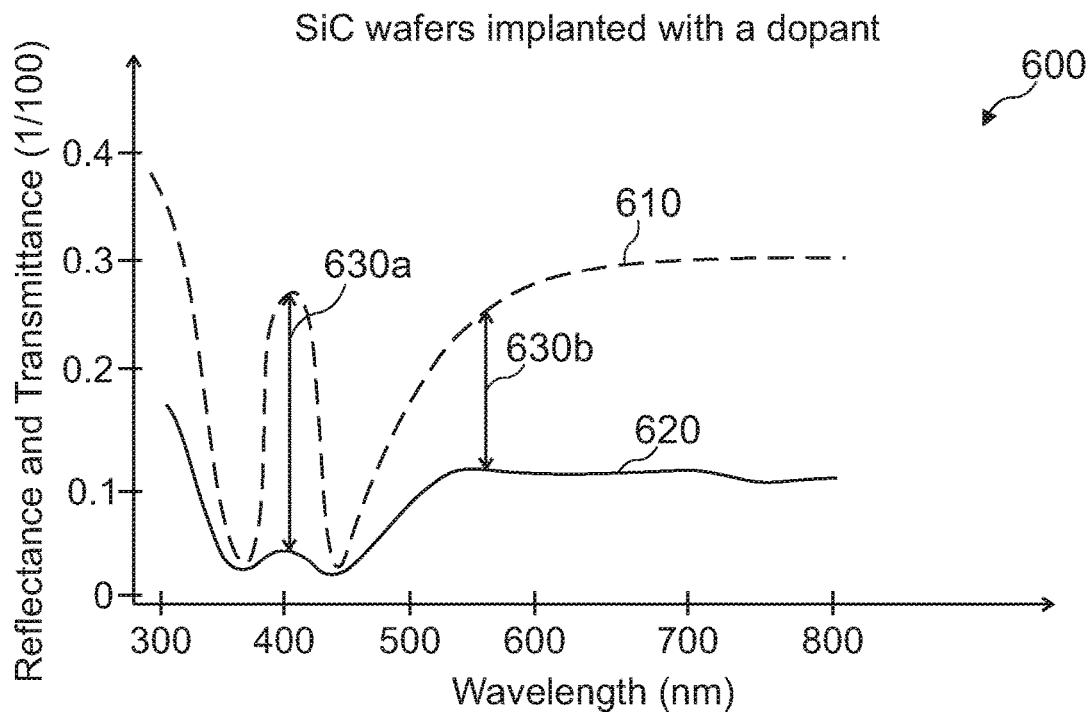
FIG. 6 shows a diagram schematically showing reflectance and transmittance of the silicon carbide wafer in dependence of a wavelength.

FIG. 6 shows a schematic diagram 600 showing reflectance and transmittance of the silicon carbide wafer in dependence of a target wavelength. The absorption of light in the silicon carbide wafer is high at low values of reflectance and transmittance.

Diagram 600 shows two exemplary plots of transmission of light through a silicon carbide wafer, wherein a first transmission line 610 shows the transmission of light through an undoped silicon carbide wafer and a second transmission line 620 shows the transmission of light through a doped silicon carbide wafer, e.g. comprising an absorption layer doped with phosphorous P. Alternatively, the silicon carbide wafer may be doped with nitrogen N, for example, to form the absorption layer. As can be seen in FIG. 6, at a wavelength of e.g. around 400 nm, a first difference 630a between the values of the transmission lines 610 and 620 is high, so that at this wavelength light irradiated to the silicon carbide wafer with an absorption layer transmits through the (e.g. undoped) silicon carbide material of the silicon carbide wafer outside the absorption layer and is absorbed to a high amount within the absorption layer. Therefore, a wavelength of around 400 nm is a suitable target wavelength for splitting the silicon carbide wafer, for example. Further, a second difference 630b between the first and second transmission line 610, 620 starts to increase at wavelengths from around 500 nm. Therefore, alternatively or additionally, a target wavelength of at least 500 nm may be used for splitting the silicon carbide wafer.

For example, at wavelengths of 300 nm and higher, the absorption of undoped silicon carbide may be lower than the absorption of doped silicon carbide (not shown in FIG. 6). Consequently, at these wavelengths, a higher amount of light may be absorbed within the absorption layer so that splitting of the absorption layer may be possible.

For example, for both P and N implantation, absorption measurements of a silicon carbide wafer with an absorption layer show an increase in absorption around 400 nm (and above 500 nm). The absorption effect e.g. is larger for N-implantation with an increase about two times due to a 300 nm layer (e.g. thickness of the absorption layer) in a 350 µm thick wafer (e.g. silicon carbide wafer). The local absorption in implant layer (e.g. absorption layer) may be about 1000 times larger than in the substrate, e.g. silicon carbide material outside the absorption layer.

More details and aspects are mentioned in connection with the embodiments described above or below. The embodiments shown in FIG. 6 may comprise one or more optional additional features corresponding to one or more aspects mentioned in connection with the proposed concept or one or more embodiments described above or below (e.g. FIGS. 1-5 and 7a-7h).

Figure 7G:
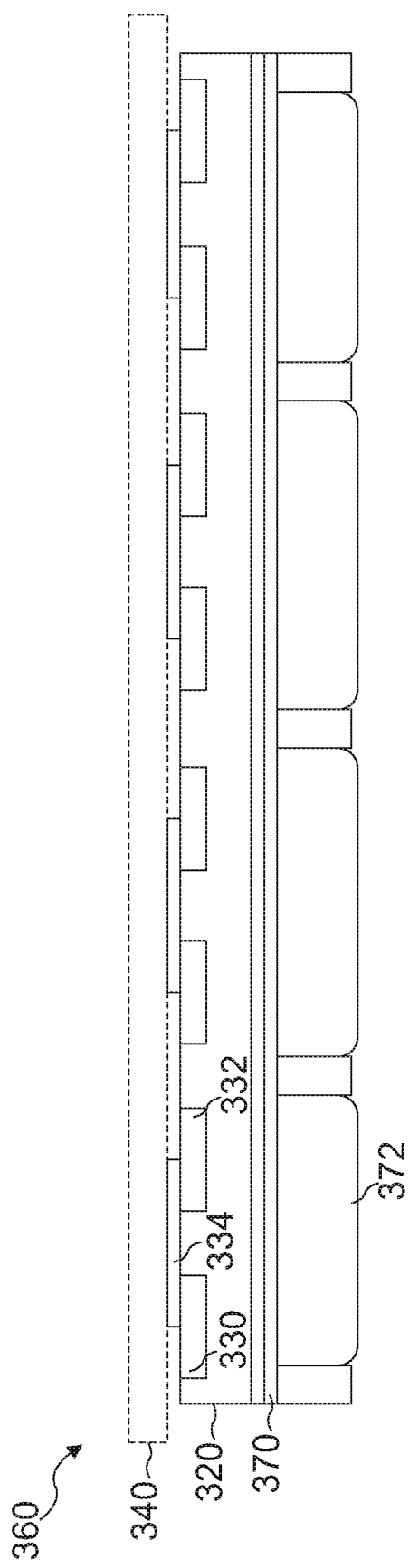

FIGS. 7a-7h show an example of a method for splitting a semiconductor wafer along an implanted layer by laser illumination. A silicon carbide (SiC) wafer 300 may be provided. The silicon carbide wafer 300 may be a 4H SiC wafer with a surface prepared for epitaxy. Ions may be implanted into the silicon carbide wafer 300 with a very high dose to generate sub-surface amorphization/supersaturation, e.g. in a sub-surface region 312, as shown in FIG. 7a. The implantation may be performed with a high dose into a depth of e.g. 0.5-5 µm with one of more of the following characteristics. The dose in the area of the depth peak (e.g., end-of-range) may be larger than an amorphous dose. For example, in later tempering/annealing processes, a poly-recrystallization of the amorphous SiC may occur, which e.g. partially comprises 3C SiC (e.g., 3C SiC may have a lower bandgap (e.g. 2.4 eV), e.g. compared to 4H SiC (e.g. 3.2 eV)). Alternatively or additionally, ions may be implanted with an implantation dose larger than a solubility in the SiC, e.g. in later tempering processes segregations of the implanted ions may form in the SiC (e.g. Al→aluminum carbide (AlC), Ta→TaC, B→BC, Ti→TiC, Ni→Ni2Si). Alternatively or additionally, the implanted ions may form a strong absorption band after their integration into the SiC crystal lattice (e.g. N, V, B, Ar, C, Ni, Si, Ti).

For example, after the implantation, an epi (epi: epitaxial) process may be executed, as shown in FIG. 7b. An epitaxial layer 320 may be grown. The epitaxial layer 320 may contain at least one of a drain layer, a buffer layer, a backside emitter and a drift layer of a silicon carbide semiconductor device, which may for example be a transistor or a diode. In particular, the epitaxial layer 320 may be grown before the silicon carbide wafer is split. A thickness of the epitaxial layer may be at least as great as the greater one of the two thickness values for a) desired electric blocking capacity; b) requested mechanical stability for a split-off layer. During epitaxy, the buried implanted area may heal at least partially and may form an absorption layer 310 (e.g. the absorption layer 310 may be at a wavelength at which the SiC wafer 300 is substantially transparent or substantially opaque). E.g., epi-growth may be performed together with recrystallization of the amorphous region/precipitation/high dose doping.

Alternatively or additionally, concepts described above or below (e.g. in the description relating to FIG. 1 or 2) may be used for forming the absorption layer 310. For example, the absorption layer may be formed by implanting ions while the SiC wafer 300 has a temperature of at least 300° C. For example, the ions may be implanted in at least two implantation processes with at least a first and a second implantation dose. For example, the SiC wafer 300 may be annealed and/or a thin epitaxial layer may be grown on a surface of the SiC wafer 300 the ions are implanted through, between implanting the first and the second implantation dose. For example, a porous layer may be formed and/or for forming the absorption layer 310 the ions may be implanted through at least a portion of a porous layer of the SiC wafer 300 (the porous layer is not shown in FIGS. 7a to 7h).

Subsequently, as shown in FIG. 7c, a process sequence required for a respective SiC device may be executed on the front side of the SiC wafer (e.g. implantation of doping areas 330, 332, manufacturing of trench structures, metallizations 334, etc.). For example, implant wells, metal layers, and/or trenches may be formed.

Optionally, a front side carrier 340 may be attached at the front side of the silicon carbide wafer 300. A laser illumination from the back side may be performed (shown in FIG. 7d, wherein the laser light is illustrated schematically by light beams 350, 352), e.g. for SiC splitting within the absorption layer, e.g. after completing the device front side. The wafer may be impinged upon/irradiated from the back side, e.g. using a laser, wherein the wafer may be mostly transparent for the used wavelength of the laser light, whereas the absorption layer might not be transparent for the used wavelength of the laser light, however. In the absorption layer, approx. 10% and/or at least 10% or at least 30% or at least 50% or at least 70% or at least 90% of the laser energy may be absorbed and consequently no damage of the metal structures at the wafer front side may result.

Due to laser power released in the absorption layer, a decomposition of the SiC in this area may result, which may lead to a lift-off, shown in FIG. 7e. Consequently, two partial wafers may be obtained: a) a system wafer or silicon carbide device wafer 360, which may comprise the drift zone, an optional buffer zone, a drain zone (in case of a diode or an IGBT, also emitter zone), and/or the front-side device structures, for example; b) a residual wafer or remaining silicon carbide wafer 362 suitable for a reclaim process (e.g. growth of an epi layer with a thickness which e.g. approximately corresponds to the split-off thickness) may be obtained, to be provided again as a substrate for a further process cycle as described above, for example. The system wafer 360 may be lifted off from the reclaim wafer 362. If applicable, the separation process of the system wafer from the residual wafer may be supported also by thermomechanical stress during and/or after laser irradiation, for example.

Figure 7H:
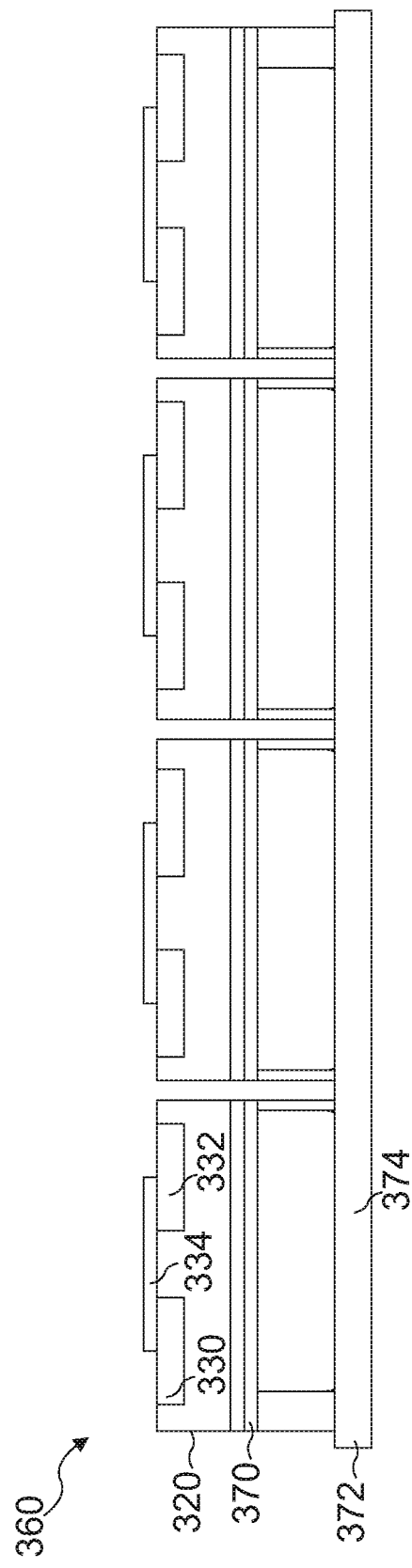

The system wafer 360 may be subjected to a back side contact metallization and subsequent dicing of the chip (shown in FIGS. 7f-h). For example, an ohmic back side contact 370 may be formed. Gluing to a glass frame and/or screen printing may be performed, for example. For example, a backside power metal 372 may be sintered. It is possible to perform planarization of the back side, removal of the front side glass carrier 340, testing, mounting the silicon carbide device wafer 360 on a sawing tape 374 and/or chip separation, for example.

More details and aspects are mentioned in connection with the embodiments described above or below. The embodiments shown in FIGS. 7a to 7h may comprise one or more optional additional features corresponding to one or more aspects mentioned in connection with the proposed concept or one or more embodiments described above or below (e.g. FIGS. 1-6).

Examples relate to splitting of silicon carbide (SiC) wafers with an epitaxial layer by laser lift-off and to forming an absorption layer for splitting the SiC wafer. It is for example proposed, e.g. by means of ion implantation before epitaxial growth of a drift zone/buffer zone/drain zone, to generate a layer just below the surface of the SiC wafer which e.g. basically consists of SiC and has an absorption coefficient which is higher by e.g. at least one order of magnitude in a certain wavelength range than the SiC wafer itself. Thus, for the splitting process, focusing of the laser may no longer be required and the thickness of the layer that is split off may be the sum of the implantation depth and the epitaxy thickness. Devices suitable for applying the method may be SiC based Power MOSFETs, diodes, J-FETs (J-FET: junction-field effect transistor), IGBTs etc.

For example, for thin wafers, the use of a carrier wafer (mounted to the front side, e.g. system side) may be advantageous. The thickness of the system wafer may be kept a minimum (e.g. <100 μm, <50 μm or even <30 μm) as the mechanical strength required for splitting and for the back side metallization may be ensured by the carrier wafer (e.g. a glass carrier), for example.

Further, deep trenches may be etched at the device boundaries/edges (e.g. in kerf) before splitting, which may reach the absorption layer (if applicable, the absorption layer may be used as etch stop and/or marker layer). After splitting, the devices may be already available as single chips on the carrier. The gaps between the chips may be temporarily filled by an easily separable medium like epoxy or spin-on silicon, for example. Before removing the carrier wafer, the system wafer may be bonded to a permanently conductive carrier: be soldered, diffusion soldered or friction bonded to a metal carrier (e.g. molybdenum (Mo), copper (Cu), etc.). The system wafer may thus have mechanical stability even with a very low semiconductor thickness. The conductive carrier may also be separated along the device boundaries (e.g. by means of laser ablation) and may remain part of the device in its completed state.

Also bonding/adhesion of the system wafer onto a sufficiently stable glass frame is possible. It may be advantageous if glass bridges stabilize the frame along the kerf areas (e.g., the kerf areas for dicing). In this case, e.g. a back side contact reinforcement may be possible by a screen printing and/or a rotogravure printing, for example involving a doctor blade in which areas between the glass bridges are filled (Cu, Ag, paste, subsequent drying and sintering steps, for example). After sintering the metallization areas and before dicing, a planarization step may be included.

By using at least one of the proposed concepts, a good control of the thickness of the split-off system wafer and the protection of the front-side metallization by the opaque characteristics of the absorption layer with the used laser wavelength may be achieved. Compared to other splitting concepts, it may be possible to execute the split-off process after completion of the front side. Thus, relatively cost and time consuming high-temperature carriers may be omitted. Further, the defects which usually exist in the start substrate may have no negative effect on the electric long-term stability of the devices, as the migration of such effects may take place in the course of the so-called bipolar degradation in the operation of the device, e.g. at a time when the substrate has already been removed. Re-Use of the SiC wafers may be enabled. The wafer costs today may be approx. 50% of the complete chip costs. Proposed concepts may enable ultra-thin wafer processes with SiC devices similar to silicon power field effect transistors (e.g. better thermomechanical characteristics, reduced contribution of resistance of SiC substrates).

After splitting, the devices may have residues of the absorption layer on the chip back sides, for example. In case the resulting back-side roughness is exploited for an improved back-side contact, the surface roughness/may be characteristic for devices formed according to at least one of the proposed concepts. Furthermore, the higher defect density within this layer may be a clear indication for the use of the proposed concept. The chip thickness may give information that a proposed splitting process/carrier concept of any form is used, as the generation of very thin SiC chips, e.g. only by means of grinding, may be relatively cost and time consuming.

SiC wafers may be expensive and may only have the function of being a mechanical support and a seed basis for the epitaxial growth of an active drift zone capable of blocking, for example. Regarding the electric characteristics, the wafer may add an undesirable resistance, which is why e.g. a portion of the wafer as large as possible may be removed by grinding from the front side after processing according to some concepts (e.g. with a target thickness ~110 µm assuming a wafer thickness of 350 µm). This grinding process may be cost and time consuming as SiC is a hard material and the abraded expensive monocrystalline SiC is lost for further processing. It may be an aspect to find ways to separate the non-required portion of the SiC wafer in a non-destructive manner (e.g. instead of grinding) and provide the same as a start wafer for a further (re-)use. Thus, the relative basic material costs of the SiC start wafer may be reduced substantially as in case of a repeated reuse in the overall process the proportional wafer consumption e.g. in case of a 5 time reuse may be reduced to ~20%. It may be necessary to be capable of splitting off a certain thickness of the wafer with a high accuracy.

Some reference splitting concepts may use hydrogen implantation and annealing. For example, only thin layers may be split off, depending on the implantation depth (implantation energy). In order to split off 20-40 µm (e.g. thickness for a later SiC chip) high implantation energies at the same time requiring high ion current would be necessary. Due to thermal induction of the split-off process in some processes in a range from 800° C.-1200° C. this might not compatible with high-temperature processes like SiC epitaxy (e.g. around 1600° C.), dopant activation annealing (e.g. around 1800° C.) and possibly trench rounding (e.g. around 1500° C.). This may either lead to a too early partial split off of the system wafer or an omission of the splitting process may result due to hydrogen diffusion, for example according to some concepts. Consequently, some split-off processes may only be used before epitaxy in combination with a high-temperature compatible carrier system, for example.

Some methods may be based on the irradiation using a focused laser having a wavelength within the absorption gap of SiC, for example. In the focal point, by high photon density a charge carrier plasma may be generated which in turn may increase absorption, for example. Consequently, a positive feedback mechanism may result which e.g. allows to locally decompose the SiC and thus generate a splitting level which may subsequently be used for the splitting process with supporting thermo-mechanical stress. The splitting level may be influenced by the quality of the optical system and might not automatically be adjusted with respect to the active zone of the device. For example, the splitting process may be executed when processing the devices is more or less completed (short thin-wafer process). For example, the wafer may be already metallized at the front side. If the wafer back side is irradiated by the laser and the laser light is not immediately completely absorbed in the focal plane, laser power radiating through to the front side may damage the metal/semiconductor interface there, for example.

Manufacturing of a mechanical separating layer may be enabled e.g. by bonding a thin monocrystalline SiC layer to a patterned nitride layer and/or by manufacturing porous SiC with a subsequent epitaxial growth. Presented concepts propose e.g. optimization of implantation dose and among others different measures for wafer reclaim.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for processing a silicon carbide wafer, the method comprising:
   implanting ions into the silicon carbide wafer to form an absorption layer in the silicon carbide wafer, wherein for light of a target wavelength, an absorption coefficient of the absorption layer is at least 100 times an absorption coefficient of a silicon carbide material of the silicon carbide wafer outside the absorption layer;
   splitting the silicon carbide wafer along the absorption layer at least by irradiating the silicon carbide wafer with light of the target wavelength to obtain a silicon carbide device wafer and a remaining silicon carbide wafer; and
   after forming the absorption layer, forming a porous silicon carbide layer at a first side of the silicon carbide wafer,
   wherein the porous silicon carbide layer vertically extends at least into a region of the silicon carbide wafer comprising the absorption layer,
   wherein an implantation dose for forming the absorption layer is at most $1.35 \cdot 10^{16}$ cm$^{-2}$.

2. The method of claim 1, wherein a temperature of the silicon carbide wafer during the implanting of the ions is at least 300° C.

3. The method of claim 1, wherein implanting the ions comprises:
   implanting ions with a first implantation dose;
   obtaining a wafer surface with reduced near surface crystal defects; and
   after obtaining the wafer surface with reduced near surface crystal defects, implanting ions with a second implantation dose.

4. The method of claim 3, wherein the first implantation dose is at most $1.35 \cdot 10^{16}$ cm$^{-2}$ and the second implantation dose is at most $1.35 \cdot 10^{16}$ cm$^{-2}$.

5. The method of claim 3, wherein obtaining the wafer surface with reduced near surface crystal defects comprises:
   annealing the silicon carbide wafer after implanting the ions with the first implantation dose.

6. The method of claim 3, wherein the ions with the first implantation dose are implanted with a first implantation energy and the ions with the second implantation dose are implanted with a second implantation energy, and wherein the second implantation energy differs by at least 5% from the first implantation energy.

7. The method of claim 3, wherein the ions with the first implantation dose are implanted with a first implantation energy and the ions with the second implantation dose are implanted with a second implantation energy, and wherein the second implantation energy is higher than the first implantation energy.

8. The method of claim 3, wherein obtaining the wafer surface with reduced near surface crystal defects comprises:
   forming a silicon carbide layer on a first side of the silicon carbide wafer after implanting the ions with the first implantation dose from the first side.

9. The method of claim 8, wherein forming the silicon carbide layer comprises epitaxially growing a silicon carbide layer or depositing the silicon carbide layer by chemical vapor deposition.

10. The method of claim 8, wherein the silicon carbide layer has a thickness of at least 50 nm and of at most 200 nm.

11. The method of claim 1, wherein the ions are implanted through at least a part of the porous silicon carbide layer.

12. The method of claim 1, wherein the absorption layer is formed within the porous silicon carbide layer.

13. The method of claim 1, wherein the porous silicon carbide layer has a thickness of at least 0.5 μm and of at most 2.0 μm.

14. A method for processing a silicon carbide wafer, the method comprising:
   implanting ions into the silicon carbide wafer through a porous silicon carbide layer of the silicon carbide wafer at a first side of the silicon carbide wafer to form an absorption layer in the silicon carbide wafer;
   splitting the silicon carbide wafer along the absorption layer at least by irradiating the silicon carbide wafer with light of a target wavelength to obtain a silicon carbide device wafer and a remaining silicon carbide wafer; and
   removing, from the first side of the silicon carbide wafer, a surface layer of the silicon carbide wafer,
   wherein a thickness of the surface layer extends from a first surface of the silicon carbide wafer into the silicon carbide wafer,
   wherein the surface layer has a thickness of less than 100 nm,
   wherein the ions are implanted from the first side,
   wherein the surface layer is removed after implanting the ions and before splitting the silicon carbide wafer.

15. The method of claim 14, wherein the target wavelength is between 370 nm and 430 nm or between 620 nm and 720 nm.

16. The method of claim 14, wherein removing the surface layer from the first side comprises etching the first side of the silicon carbide wafer.

17. The method of claim 14, wherein, after removing the surface layer from the first side of the silicon carbide wafer, a maximal vacancy concentration within a layer at the first side of the silicon carbide wafer is at most $3 \cdot 10^{22}$ cm$^{-3}$, and wherein the layer has a thickness of 10 nm and a thickness of the layer extends from the surface of the silicon carbide wafer into the silicon carbide wafer.

18. The method of claim 14, wherein the ions are implanted with an implantation dose higher than an amorphous dose necessary for amorphization of silicon carbide material of the absorption layer.

19. The method of claim 14, wherein the ions are implanted into the silicon carbide wafer with an implantation dose higher than a solubility of the ions in the silicon carbide material of the silicon carbide wafer so that precipitation occurs within the absorption layer, during annealing the silicon carbide wafer.

20. The method of claim 14, wherein the implanted ions are at least one of nitrogen ions, phosphorus ions, vanadium ions, boron ions, argon ions, carbon ions, nickel ions, silicon ions, titanium ions, tantalum, molybdenum, tungsten ions, gallium ions and aluminum ions.

21. The method of claim 14, wherein a thickness of the absorption layer is at least 300 nm and at most 600 nm.

22. The method of claim 14, wherein the absorption layer is formed within the silicon carbide wafer at a distance to a surface of the silicon carbide wafer of at least 500 nm and at most 5 μm.

23. The method of claim 14, wherein the absorption layer has a 3C-crystal structure and the silicon carbide material of the silicon carbide wafer surrounding the absorption layer has a 4H-crystal structure.

24. The method of claim 14, wherein at least 10% of the light of the target wavelength penetrating through the silicon carbide material of the silicon carbide wafer outside the absorption layer is absorbed by the absorption layer.

25. The method of claim 14, further comprising at least one of the following steps during and/or after irradiating the silicon carbide wafer with the light of the target wavelength:
heating the silicon carbide wafer;
applying mechanical force and/or stress to the silicon carbide wafer; and
ultrasonically treating the silicon carbide wafer.

26. The method of claim 14, further comprising:
before splitting the silicon carbide wafer, growing an epitaxial layer on the first side of the silicon carbide wafer.

27. The method of claim 14, wherein the epitaxial layer has a thickness of at least 5 μm and of at most 300 μm.

28. The method of claim 14, further comprising:
forming a further absorption layer within the remaining silicon carbide wafer; and
splitting the remaining silicon carbide wafer along the further absorption layer.

\* \* \* \* \*